(12) United States Patent
Monroe et al.

(10) Patent No.: US 11,469,073 B2
(45) Date of Patent: Oct. 11, 2022

(54) CRYOGENIC TRAPPED-ION SYSTEM

(71) Applicant: University of Maryland, College Park, College Park, MD (US)

(72) Inventors: Christopher Monroe, Ellicott City, MD (US); Guido Pagano, Washington, DC (US); Paul W. Hess, Middlebury, VT (US); Harvey B. Kaplan, College Park, MD (US); Wen Lin Tan, College Park, MD (US); Philip J. Richerme, Bloomington, IN (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 0 days.

(21) Appl. No.: 17/306,301

(22) Filed: May 3, 2021

(65) Prior Publication Data
US 2021/0319973 A1    Oct. 14, 2021

Related U.S. Application Data

(62) Division of application No. 16/408,151, filed on May 9, 2019, now Pat. No. 10,998,163.

(60) Provisional application No. 62/670,100, filed on May 11, 2018.

(51) Int. Cl.
*H01J 37/08*    (2006.01)
*H01J 37/18*    (2006.01)

(52) U.S. Cl.
CPC ............. *H01J 37/08* (2013.01); *H01J 37/18* (2013.01)

(58) Field of Classification Search
CPC ........ H01J 37/08; H01J 37/18; H01J 49/4225; G06N 10/00; G01L 21/30; F25B 9/10; F25B 9/14; F25D 19/00

USPC ........................... 250/281; 73/31.04; 700/54
See application file for complete search history.

(56) References Cited

U.S. PATENT DOCUMENTS 9,134,450 B2    9/2015    Desruelle et al.

FOREIGN PATENT DOCUMENTS

WO    2015128438 A1    9/2015

OTHER PUBLICATIONS

Fishman, et al ("Structural phase transitions in low-dimensional ion crystals" Phys. Rev. B 77, 064111 (2008)) (Year: 2008).*

(Continued)

*Primary Examiner* — Michael Maskell
(74) *Attorney, Agent, or Firm* — ArentFox Schiff LLP

(57) ABSTRACT

The disclosure describes various aspects of a cryogenic trapped-ion system. In an aspect, a method is described that includes bringing a chain of ions in a trap at a cryogenic temperature, the trap being a micro-fabricated trap, and performing quantum computations, simulations, or both using the chain of ions in the trap at the cryogenic temperature. In another aspect, a method is described that includes establishing a zig-zag ion chain in the cryogenic trapped-ion system, detecting a change in a configuration of the zig-zag ion chain, and determining a measurement of the pressure based on the detection in the change in configuration. In another aspect, a method is described that includes measuring a low frequency vibration, generating a control signal based on the measurement to adjust one or more optical components, and controlling the one or more optical components using the control signal.

8 Claims, 18 Drawing Sheets

(56) References Cited

OTHER PUBLICATIONS

International Search Report and Written Opinion corresponding to International Application No. PCT/US2019/031779, dated Aug. 22, 2019.
Pagano, G., et al., "Cryogenic Trapped-Ion System for Large Scale Quantum Simulation", arxiv.org, Cornell University Library, Cornell University, Feb. 9, 2018.
International Written Opinion corresponding to International Application No. PCT/US2019/031779, dated Apr. 3, 2020.
Porras, D. et al., Effective Quantum Spin Systems with Trapped Ions, Physical Review Letters, vol. 92, No. 20, May 21, 2004, 4 pages.
Bohnet, Justin G. et al., Quantum Spin Dynamics and Entanglement Generation with Hundreds of Trapped Ions, Science, vol. 352, issue 6291, Jun. 10, 2016, 6 pages.
Hess, P.W. et al., Non-Thermalization in Trapped Atomic Ion Spin Chains, Philosophical Transactions of the Royal Society of London A: Mathematical, Physical and Engineering Sciences, vol. 375, Jun. 27, 2017, 16 pages.
Jurcevic, P., et al. Direct Observation of Dynamical Quantum Phase Transitions in an Interacting Many-Body System, Physical Review Letters, vol. 119, 2017, 5 pages.
Zhang, J. et al., Observation of a Many-Body Dynamical Phase Transition with a 53-Qubit Quantum Simulator, Nature, vol. 551, 2017, 8 pages.
Gabrielse, G. et al., Precision Mass Spectroscopy of the Antiproton and Proton Using Simultaneously Trapped Particles, Physical Review Letters, vol. 82, No. 16, Apr. 19, 1999, 4 pages.
Kim, K. et al., Entanglement and Tunable Spin-Spin Couplings Between Trapped Ions Using Multiple Transverse Modes, Physical Review Letters, vol. 103, 2009, 4 pages.
Poitzsch, M.E. et al., Cryogenic Linear Ion Trap for Accurate Spectroscopy, Review of Scientific Instruments, vol. 67(1), Jun. 1996, 6 pages.
Sage, J.M. et al., Loading of a Surface-Electrode Ion Trap from a Remote, Precooled Source, Physical Review A, vol. 86, 2012, 10 pages.
Schwarz, M. et al., Cryogenic linear Paul trap for cold highly charged ion experiments, AIP Review of Scientific Instruments, vol. 83, 2012, 11 pages.
Niedemayr, M. et al., Cryogenic Surface Ion Trap Based on Intrinsic Silicon, New Journal of Physics, vol. 16, 2014, 14 pages.
Brandl, M.F. et al., Cryogenic Setup for Trapped Ion Quantum Computing, Review of Scientific Instruments, vol. 87, 2016, 12 pages.
Alonso, J. et al., Generation of Large Coherent States by Bang-Bang Control of a Trapped-Ion Oscillator, Nature Communications, vol. 7, 2016, 8 pages.
Turchett, Q.A. et al., Heating of Trapped Ions from the Quantum Ground State, Physical Review A, vol. 61, 2000, 8 pages.
Brownnut, M. et al., Ion-Trap Measurements of Electric-Field Noise Near Surfaces, Reviews of Modern Physics, vol. 87, 2015, 71 pages.
Labaziewicz, J. et al., Suppression of Heating Rates in Cryogenic Surface-Electrode Ion Traps, Physical Review Letters, vol. 100, 2008, 4 pages. Rownnutt, M. et al., Ion-trap measurements of electric-field noise near surfaces, 71 pages.
Zipkes, Christoph et al., Kinetics of a single trapped ion in an ultracold buffer gas, New Journal of Physics, vol. 13, 2011, 19 pages.
Cetina, M. et al., Micromotion-Induced Limit to Atom-Ion Sympathetic Cooling in Paul Traps, Physical Review Letters, vol. 109, 2012, 6 pages.
Chen, K. et al., Neutral Gas Sympathetic Cooling of an Ion in a Paul Trap, Physical Review Letters, vol. 112, 2014, 9 pages.
Mamun, M.A.A. et al., Effect of Heat Treatments and Coatings on the Outgassing Rate of Stainless Steel Chambers, Journal of Vacuum Science & Technology A: Vacuum, Surfaces, and Films, vol. 32, 2014, 32 pages.
Olmschenk, S. et al., Manipulation and Detection of a Trapped Yb+ Ion Hyperfine Qubit, Physical Review A, vol. 76, 2007, 10 pages.
Stick, D. et al., Ion trap in a semiconductor chip, Nature Physics, vol. 2, Jan. 2006, 4 pages.
Macalpine, W.W. et al., Coaxial Resonators with Helical Inner Conductor, Proceedings of the IRE, vol. 47, 1959, 7 pages.
Siverns, J. D. et al., On the Application of Radio Frequency Voltages to Ion Traps via Helical Resonators, Applied Physics B 107, 2012, 14 pages.
Johnson, K.G. et al., Active Stabilization of Ion Trap Radiofrequency Potentials, Review of Scientific Instruments, vol. 87, 2016, 7 pages.
Ryjkov, V.L. et al., Simulations of the RF Heating Rates in a Linear Quadrupole Ion Trap, Physical Review A, vol. 71, 2005, 4 pages.
Alheit, R. et al., Higher Order Non-Linear Resonances in a Paul Trap, International Journal of Mass Spectrometry and Ion Processes, vol. 154, 1996, 15 pages.
Drakoudis, A. et al., Instabilities of Ion Motion in a Linear Paul Trap, International Journal of Mass Spectrometry 252, 2006, 8 pages.
Jachymski, K. et al., Quantum Theory of Reactive Collisions for 1/rn Potentials, Phys. Rev. Lett. 110, 2013, 5 pages.
Lehmitz, H. et al., Population Trapping in Excited Yb Ions, Phys. Rev. Lett. 62, 1989, 4 pages.
Sugiyama, K. et al., Production of YbH+ by Chemical Reaction of Yb+ in Excited States with H2 Gas, Phys. Rev. A 55, 1997, 4 pages.
Fishman, S. et al., Structural Phase Transitions in Low-Dimensional Ion Crystals, Physical Review B, vol. 77, 2008, 10 pages.
Lin, G.-D et al., Sympathetic Cooling in a Large Ion Crystal, Quantum Information Processing 15, 2015, 8 pages.
Lin, G.-D et al., Large Scale Quantum Computation in an Anharmonic Linear Ion Trap, Europhysics Letters 86, 2009, 6 pages.
Home, J. P . et al., Normal Modes of Trapped Ions in the Presence of Anharmonic Trap Potentials, New Journal of Physics 13, 2011, 26 pages.
Lee, A.C. et al., Engineering Large Stark Shifts for Control of Individual Clock State Qubits, Physical Review A, vol. 94, 2016, 7 pages.
Daley, A. J., Quantum Trajectories and Open Many-Body Quantum Systems, Advances in Physics 63, 2014, 66 pages.

\* cited by examiner

CRYOGENIC TRAPPED-ION SYSTEM

CROSS REFERENCE TO RELATED APPLICATIONS

The present application is a divisional application of U.S. patent application Ser. No. 16/408,151, filed May 9, 2019, which claims priority to and the benefit from U.S. Provisional Patent Application No. 62/670,100, entitled "CRYOGENIC TRAPPED-ION SYSTEM," and filed on May 11, 2018, the contents of which are incorporated herein by reference in their entirety.

GOVERNMENT LICENSE RIGHTS

This invention was made with government support under Grant/Contract No. 03130638 awarded by the Intelligence Advanced Research Projects Activity (IARPA). The government has certain rights in the invention.

BACKGROUND OF THE DISCLOSURE

Aspects of the present disclosure generally relate to quantum information processing systems, and more specifically, cryogenic trapped-ion system for large scale quantum operations, including large scale quantum simulation.

Trapped atomic ions is one of the quantum information processing (QIP) approaches that has delivered universal and fully programmable machines. Trapped atomic ions are also a leading platform for quantum information networks (QINs), in which long-lived identical qubit memories can be locally entangled through their Coulomb interaction and remotely entangled through photonic channels. Systems based on trapped atomic ions that operate at room temperature can face collisions between residual background molecules or atoms and the trapped atomic ions, and these collision can result in the crystal or lattice with the trapped atomic ions melting, which may require constant and/or fast recoveries to continue operation, if such recoveries are possible.

Accordingly, systems based on trapped atomic ions that can reduce the pressure caused by residual background molecules or atoms are desirable to improve the overall performance of such systems.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the present disclosure, a method for operating a trapped-ion system is described that includes bringing a chain of ions in a trap at a cryogenic temperature, the trap being a micro-fabricated trap, and performing quantum computations, simulations, or both using the chain of ions in the trap at the cryogenic temperature. The trap can include at least 30 ions, for example.

In another aspect of the present disclosure, a method for performing a pressure measurement in a cryogenic trapped-ion system is described that includes establishing a zig-zag ion chain in the cryogenic trapped-ion system, detecting a change in a configuration of the zig-zag ion chain, and determining a measurement of the pressure based on the detection in the change in configuration.

In another aspect of the present disclosure, a method to compensate for low frequency vibrations in a quantum information processing (QIP) system is described that includes measuring a low frequency vibration, generating a control signal based on the measurement to adjust one or more optical components, and controlling the one or more optical components using the control signal.

In another aspect of this disclosure, a quantum information processing (QIP) system for operating a trapped-ion system is described that includes means for bringing a chain of ions in a trap at a cryogenic temperature, the trap being a micro-fabricated trap and the chain of ions having at least 30 ions, and means performing one or both of a quantum computation or a quantum simulation using the chain of ions in the trap at the cryogenic temperature.

In another aspect of this disclosure, a QIP system for performing a pressure measurement in a cryogenic trapped-ion system is described that includes means for establishing a zig-zag ion chain in the cryogenic trapped-ion system, means for detecting a change in a configuration of the zig-zag ion chain, and means for determining a measurement of the pressure based on the detection in the change in configuration.

In another aspect of this disclosure, a QIP system to compensate for low frequency vibrations in the QIP system is described that includes means for measuring a low frequency vibration, means for generating a control signal based on the measurement to adjust one or more optical components, and means for controlling an operation of the one or more optical components using the control signal.

In another aspect of this disclosure, a computer-readable medium storing code with instructions executable by a processor for operating a trapped-ion system is described that includes code for bringing a chain of ions in a trap at a cryogenic temperature, the trap being a micro-fabricated trap and the chain of ions having at least 30 ions, and code for performing one or both of a quantum computation or a quantum simulation using the chain of ions in the trap at the cryogenic temperature.

In another aspect of this disclosure, a computer-readable medium storing code with instructions executable by a processor for performing a pressure measurement in a cryogenic trapped-ion system is described that includes code for establishing a zig-zag ion chain in the cryogenic trapped-ion system, code for detecting a change in a configuration of the zig-zag ion chain, and code for determining a measurement of the pressure based on the detection in the change in configuration.

In another aspect of this disclosure, a computer-readable medium storing code with instructions executable by a processor to compensate for low frequency vibrations in a QIP system is described that includes code for measuring a low frequency vibration; code for generating a control signal based on the measurement to adjust one or more optical components, and code for controlling an operation of the one or more optical components using the control signal.

BRIEF DESCRIPTION OF THE DRAWINGS

The appended drawings illustrate only some implementation and are therefore not to be considered limiting of scope.

DETAILED DESCRIPTION

Figure 1A:
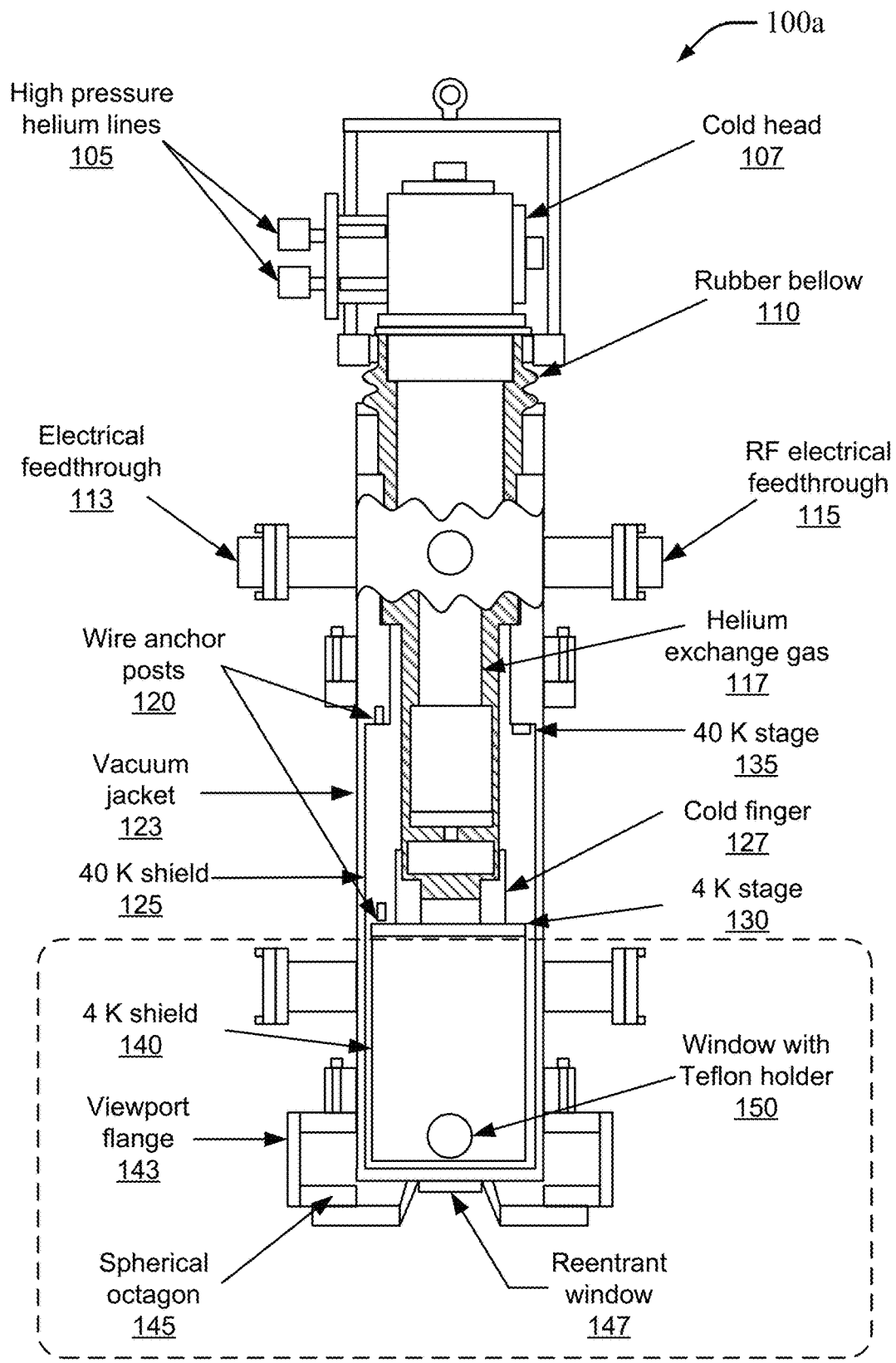
FIGS. 1(a) and 1(b) are diagrams that illustrates an example of a cryogenic vacuum apparatus in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

Various aspects of this disclosure are presented below in more detail. In general, the present disclosure proposes the use of a cold environment for trapped atomic ions, a cryogenic environment, to reduce pressure. That is, one of the goals is to improve upon the limitations on trapped atomic ion apparatuses caused by residual gas hitting the ions that are trapped.

A trapped ion system at room temperature can experience collisions between residual background molecules (or atoms) that take place quite regularly. For example, in a large system with 60 or so atomic ions, a collision can occur approximately every minute and when one of the ions gets hit, the whole chain, crystal, or lattice formed to contain the ions can melt. This can cause the need to recover from collisions every minute, which hinders system operation.

By using a cryogenic system (e.g., with temperatures below 20 Kelvin (K), including temperatures at or near 4 K) the background gas pressure is much better since the molecules or atoms tend to stick to surfaces and not freely move. This is a brute force approach to reduce the collision problem, but one that is effective. By reducing the pressure in this manner, there are very few collisions taking place. That, however, opens the opportunity to detect the collisions one at a time and use these detections for diagnostics purposes.

Another aspect of using cryogenic systems for trapped ion quantum computation is that for an ion trap a high voltage radio frequency (RF) signal is applied to the electrodes and that can cause a heat load and elevated temperatures of the electrodes. When trying to keep operations at or near 4 K, this heat load can be an issue. Moreover, the RF source is a tuned circuit and the tuning changes at lower temperatures. It may therefore be necessary to pre-tune the RF source prior to operations so that any changes that take place at lower temperatures places the RF source at the appropriate tuning.

These are various aspects of the use of cryogenic systems for trapped ion operations, which may be needed to enable operations in large systems (e.g., systems with more than 25, 30, 35, 40, 45, 50, 60, 70, 80, 90, or 100 ions) since the likelihood of collisions increase with the number of trapped ions. With increased likelihood of collisions comes an increased possibility that the chain with the trapped ions melts and would require some form of recovery process. If such recovery process is needed regularly and takes a significant amount of time, the overall operation of the system can be severely degraded. To avoid or reduce these situations, cryogenic systems can be used to reduce the background pressure, and therefore, the likelihood of collisions.

As described above, with the use of cryogenic systems it is possible to detect the collisions one at a time and use these detections for diagnostics purposes, such as a pressure meter or sensor, for example. One technique proposed in this disclosure is to have a linear chain of trapped ions and use this linear chain for pressure detection because the linear chain can be very sensitive to collisions. If a collision with the linear chain is a catastrophic event, then the whole crystal or lattice melts and the trapped ions go dark. The trapped ions may come back but this can happen very fast and may not be seen or detected.

If the linear chain is instead squeezed, the first thing that happens is that it buckles and forms a zig-zag configuration (see e.g., FIG. 10), and then by slightly loosen it so that it is close to being linear again, the chain is now fragile and highly sensitive to any perturbation. As such if a single collision were to occur with the chain while in this condition, the chain can change from a "zig" configuration to a "zag" configuration, with a probability of 50%. One way to look at it is that if the chain is buckled at the middle it forms a "W" or an "M." A change in configuration can then be seen or detected when an "M" changes into a "W" or when a "W" changes into an "M."

Interactions between particles and the crystal or lattice with the trapped ions can be of different types. Whenever a collision is an elastic collision, basically a particle (e.g., molecule or atom) arrives at the crystal, interacts with the crystal, and then goes away. But there may be collisions were the interaction between the particle and an ion in the crystal causes the ion to transform to a molecule or inelastically populate an internal electronic state that does not fluoresce, in either case causing the ion to go dark, and this can be detected. When the ion goes dark it may not be seen but there is typically a hole in the chain where the ion is supposed to be so the ion is present but dark.

Using cryogenic systems for diagnostic purposes allows the detection of the rate at which these types of events occur to get the pressure, but this pressure measurement is a relative measurement of pressure. To have an absolute measurement a reference is also needed. If a reference is available, then a comparison can be made and an absolute pressure measurement can be obtained using the techniques described herein. That is, it is possible to detect pressure changes by making measurements of relative rates (e.g., rates for ions to go dark).

The lower pressure provided by cryogenic systems may be less important in deep macroscopic traps with electrodes surrounding the ions. However, in micro-fabricated traps, which are shallower, the lower pressure provided by cryogenic systems may be needed to avoid collisions and retain the chain.

In addition to the lower pressure provided by cryogenic systems, another advantage is in the reduction of the heating rate. For example, when the ions get too close to the trap electrodes, the noise (thermally or otherwise driven) from the electrodes can cause the ions to heat up over time, which is characterized by the heating rate. Therefore, one approach to reduce the effect of thermally-driven noise on the ions in the trap is to reduce the overall temperature by using a cryogenic system. That is, the trap electrodes may be brought to cryogenic temperatures as described in more detail herein.

As described above, cryogenic systems may be needed to support large numbers of ions because collisions are more likely the larger the number of ions. A threshold number of ions for which a cryogenic system is needed may be based, at least partially, on the time it takes to load the ions into the trap. An atomic source emits the atoms that are eventually ionized and trapped, and this process can be a long process so the time between collisions should be much larger than the time it takes to set up an ion chain in a trap and the set up time depends on the number of ions.

Moreover, to do long quantum computations or experiments, where data is taken for a sequence of operations and this sequence is repeated multiple times, the time between collisions and possible disruptions needs to be longer than the time to perform the computations or experiments, and the time for computations or experiments may depend on the type of computation or experiment and on the number of qubits (e.g., ions) used.

As such, it is possible to determine a threshold value on the number of ions that can be used as a guideline for when to use a cryogenic system may be needed. Such threshold value may be based on the number of gates used in a particular computation or simulation (e.g., algorithm), on the number of qubits (e.g., ions), and/or on a probability of a collision (e.g., collision rate). For example, for a low probability of collision and short computations, a large number of qubits can be used without the need for a cryogenic system. On the other hand, for long or on-going computations or large number of qubits, even when the probability of collisions is low, a cryogenic system may be needed.

The threshold value may also be based on a recovery time. As discussed above, setting up the chain of trapped ions can take some time. If the recovery from a collision, which can include reloading ions into the trap, takes longer than the computations, then the number of ions and the types of computations supported can be limited.

Another aspect of cryogenic systems is that most of these systems use a closed cycle chiller and there is a pulse to its operation. A cooling fluid or liquid (e.g., helium) is moved through the cooling system so the system vibrates. Most of the noise caused by these vibrations is low frequency (e.g., below 10 Hz). This can cause an issue with the optical components (e.g., lasers) used in connection with the ion traps because the vibrations or movements can cause noise for the optical components. This issue needs to be mitigated to deal with residual vibrations. Some cryogenic systems try to address this issue passively by providing some form of isolation using a spring or similar structure but this approach is not always effective.

In this disclosure, techniques for handling the low frequency noise caused by the vibrations in cryogenic systems are described. For example, a Michelson interferometer can be used to measure these vibrations. These measurements can then be used to provide some form of signaling to a light modulator and/or other optical components to compensate for the vibrations. For example, instead of using an additional optical element on the optical path it may be possible to have a phase shifter on a global modulator (e.g., a global acousto-optic modulator or AOM). Essentially, the measurement signal is adjusted (e.g., multiplied by a factor or other calibrated parameter), provided to a phase shifter (radio frequency phase shifter) on the OAM phase and the phase is tracked to make the necessary adjustments to the optical components operations to compensate for the vibrations in the cooling system. This approach may be referred to as a feedforward approach but feedback techniques may also be implemented to achieve the same compensation of low frequency noise vibrations. Moreover, these low frequency noise vibrations compensation techniques can apply to cases where the source of the low frequency noise vibrations is other than a cryogenic system' closed cycle chiller.

Figures 11A, 11B, 11C:
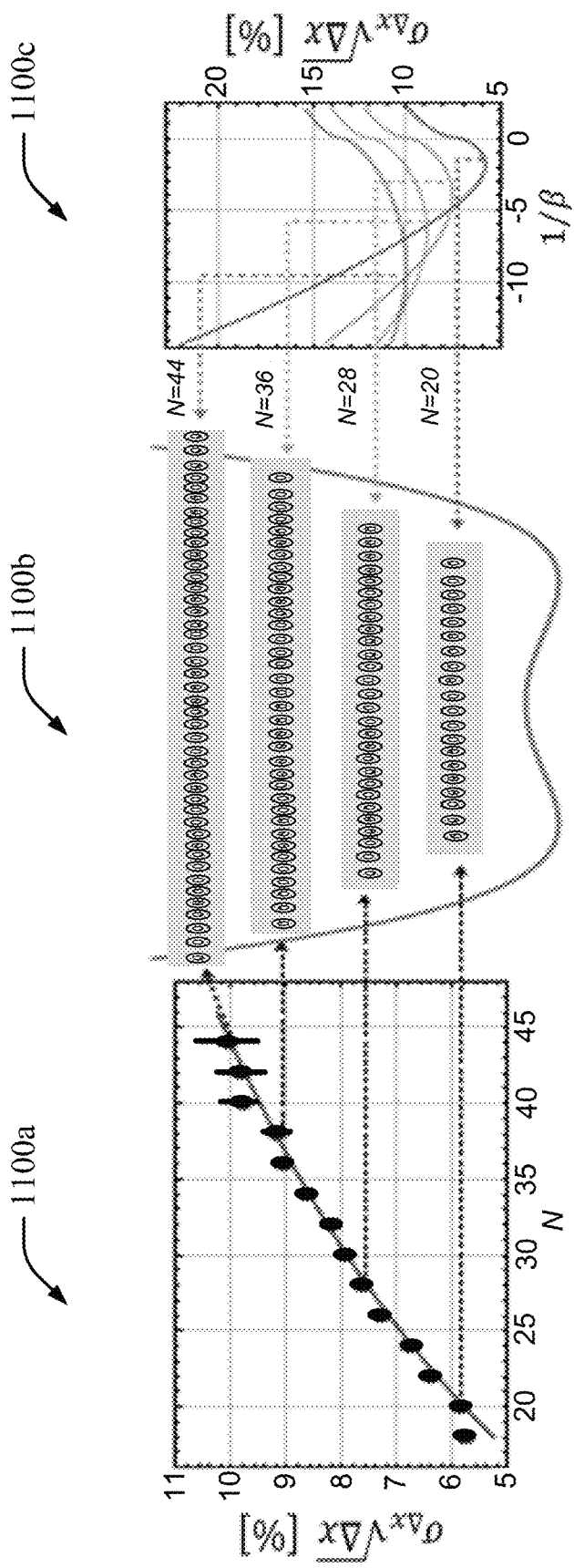
FIGS. 11(a), 11(b), and 11(c) are diagrams that illustrate an example of uniformly spaced ion chains in accordance with aspects of this disclosure.

Another aspect described herein is the ability to produce equally or uniformly spaced ion chains (see e.g., FIG. 11(b)). Crystal ions are typically placed in a parabolic well, but in such a well the ions will not be equally spaced from each other. The ions in the middle are squeezed together not only by the well but also by other ions pushing in. The ions in the outside have an imbalance and are hanging out at the end, and therefore, the ions outside are farther apart. Instead of using a parabolic well, a quartic well is suggested (e.g., having at least 5 segments and sometimes as many as 48 or more). This way, the ions will be equally spaced from each other, which for engineering purposes, it may be important to ensure that any lasers interacting with the ions are properly aligned with the ions. This is particularly relevant for systems having a large number of ions in a trap and where a large number of laser beams (e.g., sometimes as many as 32 beams or more) are needed for operations.

Additional details regarding the concepts described above, including various examples of implementations and configurations of apparatuses and systems for performing these concepts, are provided below.

This disclosure describes a novel cryogenic ion trapping system configured for large scale quantum simulation, including simulations of spin models. The apparatus or system described is based on a segmented blade trap enclosed in a 4 Kelvin (K) cryostat, which enables to routinely trap over 100 $^{171}$Yb$^+$ ions in a linear configuration, and hold them for hours due to a low background gas pressure from differential cryo-pumping. A cryostat generally refers to a device used to maintain low cryogenic temperatures of samples or devices mounted within the cryostat. The cryogenic vacuum may be characterized by using trapped ion crystals as a pressure gauge, measuring both inelastic and elastic collision rates with the molecular background gas. This disclosure also shows the capability of reducing the ion spacing inhomogeneity for chains up to 44 ions by means of anharmonic axial potentials. The reliable production and lifetime enhancement of large linear ion chains due to cryogenic vacuum can enable quantum simulations or operations that can challenge classical systems.

I. Introduction

Ions confined in radio frequency (RF) Paul traps are the leading platform for quantum simulations or operations, including the simulation of long-range spin-spin interaction models. As the system size increases, classical simulation methods, for example, become incapable of modelling the exponentially growing Hilbert space, necessitating quantum simulation for precise predictions. Currently room temperature experiments at typical ultra-high vacuum (UHV) pressures ($10^{-11}$ Torr) are limited to about 50 ions due to collisions with background gas that regularly destroy the ion crystal or lattice. The background pressure achievable in UHV vacuum is ultimately limited by degassing of inner surfaces of the apparatus. However, cooling down the system to cryogenic temperatures turns the inner surfaces into getters that trap most of the residual background gases. This technique, called cryo-pumping, has led to the lowest level of vacuum ever observed ($10^{-17}$ Torr).

This disclosure describes an experimental setup consisting of a macroscopic segmented blade trap inserted into a cryogenic vacuum apparatus that allows trapping and storage of large chains of ions for quantum operations, including the simulation of spin models. This disclosure describes the system design, focusing on a cryostat, a helical resonator supplying the RF drive to a blade trap and an atomic source. Moreover, this disclosure describes the characterization of a vibration isolation system (VIS) performance and the improvements to the mechanical stability of the whole structure inside the 4 K region. Pressure measurements using ion crystals as a pressure gauge are also described. The pressure dependence on the cryostat temperature by measuring inelastic and elastic collision rates with background H$_2$ molecules is also characterized. This disclosure also describes the capability to shape an axial potential in order to minimize the ion spacing inhomogeneity due to Coulomb repulsions to provide more uniformly spaced ion chains.

II. The Apparatus

The challenge of merging atomic physics and ion trap technology with cryogenic engineering has been undertaken in the past. Cryogenic ion traps offer two remarkable advantages: Firstly, heating rates due to surface patch potential and electric field noise can be suppressed by two orders of magnitude with respect to room temperature traps. Secondly, the low pressures achievable via differential cryo-pumping reduce the collision rate with the residual background gas and, thereby enhance the lifetime of the ions in the trap (e.g., ions are less likely or less often hit by background gas molecules). In standard UHV systems, the storage time of a large number of ions is typically limited by the probability that a "catastrophic" collision event perturbs the ion's position from the RF null of the trap. In this case, the ion motion is randomly amplified depending on the instantaneous RF phase value at the collision time, parametric heating takes place, the ion crystal or lattice melts, and the ions are either ejected out of the trap or left in highly excited orbits where laser cooling is not efficient. Assuming that the collisional loss probability scales linearly with the number of ions, in order to increase the capabilities of the trapped-ion quantum simulator platform, it is necessary to achieve a significant reduction in the background pressure. Some techniques such as titanium coating and heat treatment have been shown to achieve extreme-high vacuum (XHV) in room temperature vacuum systems. However, combining room temperature XHV with an ion trap apparatus remains a challenge because many components in the vacuum system may not be XHV-compatible.

A cryogenic apparatus offers a significant background pressure reduction at 4 K which is compatible with a high optical access design for addressing and detecting ions in a crystal. In this case, the great advantage of having very low background pressures comes at the cost of a careful design in order to: (a) minimize room temperature blackbody radiation without limiting optical access and (b) mechanically decouple the system from the cold head vibrations without compromising the thermal contact necessary to cool down the system. Various aspects related to the design and performance of the cryogenic apparatus are described below.

A. The Cryostat

In order to minimize the vibrations induced by the cryocooler, one possible choice is a flow cryostat, which features very low acoustic noise. However, it is expensive as it requires continuous replenishment of cold liquid coolant and is not very efficient in terms of cooling power. The alternative is to use a closed-cycle cryocooler which has a higher cooling power, which does not require liquid coolant to be constantly refilled and it is more convenient as it only needs external electric supply. However, a closed cycle cryocooler suffers from severe acoustic noise. This disclosure describes the use of a closed cycle Gifford-McMahon cryostat, with the vibrating cold finger mechanically decoupled from the main vacuum apparatus through an exchange gas region as shown in FIG. 1(a) filled with helium gas at a pressure of 1 psi above atmosphere. The helium gas serves as a thermal link between the cold finger and the sample mount to which the ion trap apparatus is attached. A rubber bellow is the only direct mechanical coupling between the vibrating cold head and the rest of the vacuum apparatus which is sitting on the optical breadboard. This VIS allows us to keep the vibrations amplitude within 400 nm (see section III for more details).

Figure 1B:
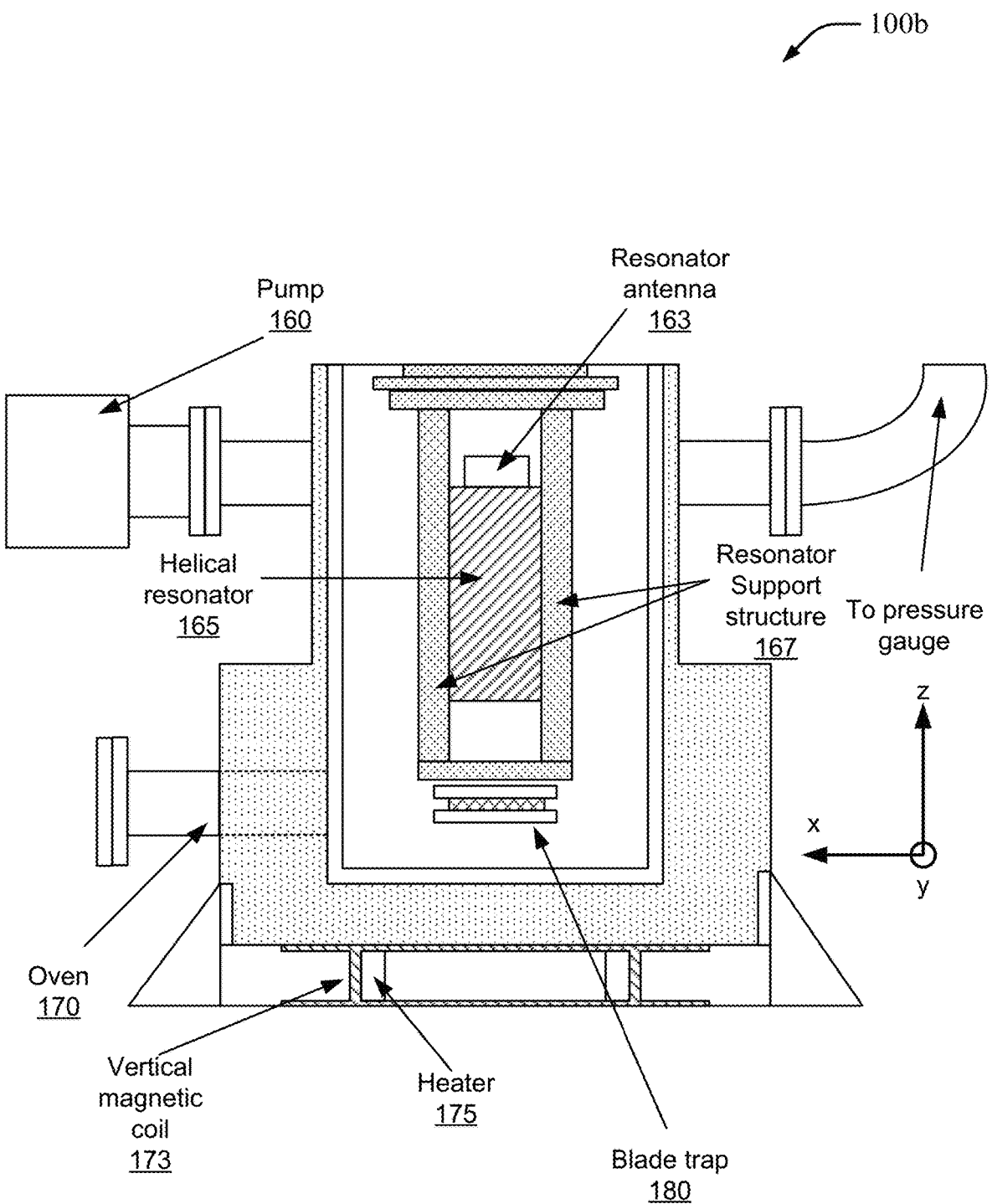

FIGS. 1(a) and 1(b) show diagrams 100a and 100b, respectively, illustrating examples of a cryogenic vacuum apparatus. FIG. 1(a) shows a side view section of the cryostat (courtesy of Janis Inc) and FIG. 1(b) shows a cross section view of the lower section (dashed lines), 90° rotated with respect to FIG. 1(a). A lower magnetic coil is mounted on the bottom of the reentrant window flange. In the coil's inner diameter is also present an aluminum heater to avoid water condensing on the outside face of the recessed window because of the exposure to the 4 K blackbody radiation coming from the inside of the apparatus.

The cryostat in FIG. 1(a) generally includes high pressure helium lines 105, cold head 107, rubber bellows 110, electrical feedthrough 113 and radio frequency (RF) electrical feedthrough 115, helium exchange gas 117, wire anchor posts 120, vacuum jacket 123, 40 K (Kelvin) shield 125, cold finger 127, 4 K stage 130, 40 K stage 135, 4 K shield 140, viewpoint flange 143, spherical octagon 145, reentrant window 147, and window with Teflon holder 150. In addition, the expanded portion in FIG. 1(b) of the cryostat shown in FIG. 1(a) may include pump 160, resonator antenna 163, helical resonator 165, resonator support structure 167, output to pressure gauge (not shown), oven 170, vertical magnetic coil 173, heater 175, and blade trap 180 (also referred to as ion trap).

On top of the cryostat (SHV-4XG-15-UHV), assembled by Janis Inc., sits a cold head (SRDK-415D2) (e.g., cold head 107) that is powered by a F-70L Sumitomo helium compressor (e.g., helium lines 105). The cold head features two stages of heat stations with different cooling powers, 45 W for the 40 K stage and 1.5 W for the 4 K stage. In order to shield the ion trap apparatus from room temperature blackbody radiation (BBR), two aluminum concentric cylindrical radiation shields are in thermal contact with the two stages (e.g., 40 K stage 135 and 4 K stage 130). Their BBR heat loads, estimated with the Stephan-Boltzmann law, are $Q_{40K}$ ~5.5 W and $Q_{4K}$ 550 µW, well below the cooling power of the two heat stages. The thermal heat load due to the electrical wiring is negligible (~100 µW) since the temperature probes (Lakeshore DT670A1-CO), the static electrodes and the ovens wires are all heat sunk to anchor posts (see e.g., wire anchor posts 120 in FIG. 1(a)) in good thermal contact with the two stages. The four SMA cables connected to the radiofrequency (RF) electrical feedthrough (e.g., RF electrical feedthrough 115) are not heat sunk and deliver a heat load of 500 mW and 220 mW on the 40 K and 4K stages, respectively. In designing the apparatus, a good balance between room temperature BBR heat load and optical access has been achieved, given the total cooling power. The spherical octagon (see e.g., spherical octagon 145 in FIG. 1(a)) features eight 1" diameter windows (e.g., windows 150) which provide optical access in the x-y plane, held by soft teflon holders. On the bottom, the system features a 2.25" diameter reentrant window (e.g., reentrant window 147) which allows for a numerical aperture (NA) up to 0.5 to image the ions along the vertical (z) direction. The whole cryostat rests on an elevated breadboard to allow for ion imaging from underneath. The total window heat load is 2.4 W on the 40 K shield and 1.7 mW on the 4 K shield. In conclusion, the total heat load budget can be well below the total cooling power and therefore we can cool the system down to 4.5 K in about 5 hours (see e.g., FIG. 2) with both the helical resonator (e.g., helical resonator 165) and the ion trap (e.g., blade trap 180) inside the 4 K shield.

Figure 2:
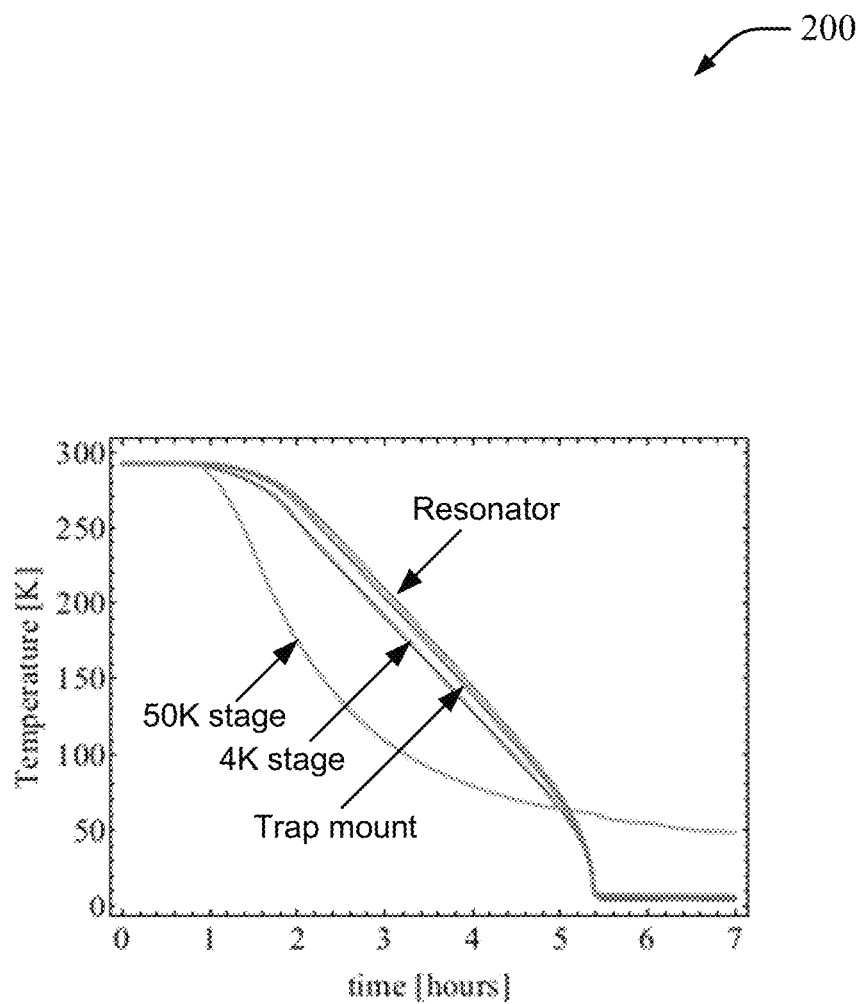
FIG. 2 is a diagram that illustrates an example of a typical cool-down cycle in accordance with aspects of this disclosure.

FIG. 2 shows a diagram 200 illustrating a typical cool-down cycle. The trap mount (e.g., blade trap 180) reaches a steady state temperature of 4.7 K while equilibrium temperature of the helical resonator (e.g., helical resonator 165) is slightly higher (~5.5 K) because of reduced thermal contact with the 4 K stage. The acceleration at the end of the cool-down is due to the sharp decrease in copper specific heat below 100 K.

Before the cool down, the apparatus is pre-evacuated using a turbo-molecular pump until the pressure reading on a MKS-390511-0-YG-T pressure gauge (not shown in FIG. 1(b)) reaches 2·$10^{-5}$ Torr. The gauge is attached through an elbow in order to avoid direct "line of sight" exposure of the 40 K shield to its radiative heat load (1.5 W). Since hydrogen is the least efficiently cryo-pumped gas, in order to avoid hydrogen leaks inside the cold region, one thing that can be added is a SAES NexTorr D-100 getter and ion pump (see e.g., pump 160 in FIG. 1(b)) which is attached to one of four CF40 flanges of the long bellow cross. The hydrogen getter needs to be activated before the cool down. During normal operation, the vibrating cold head is attached to the overhead equipment racks hanging from the ceiling and the vacuum apparatus is resting on an optical breadboard. However, by connecting the cold head and the cryostat mechanically, the entire system can be hoisted and moved from the optical breadboard to a freestanding structure where upgrades and repairs can be performed.

B. Blade Trap

Figure 3:
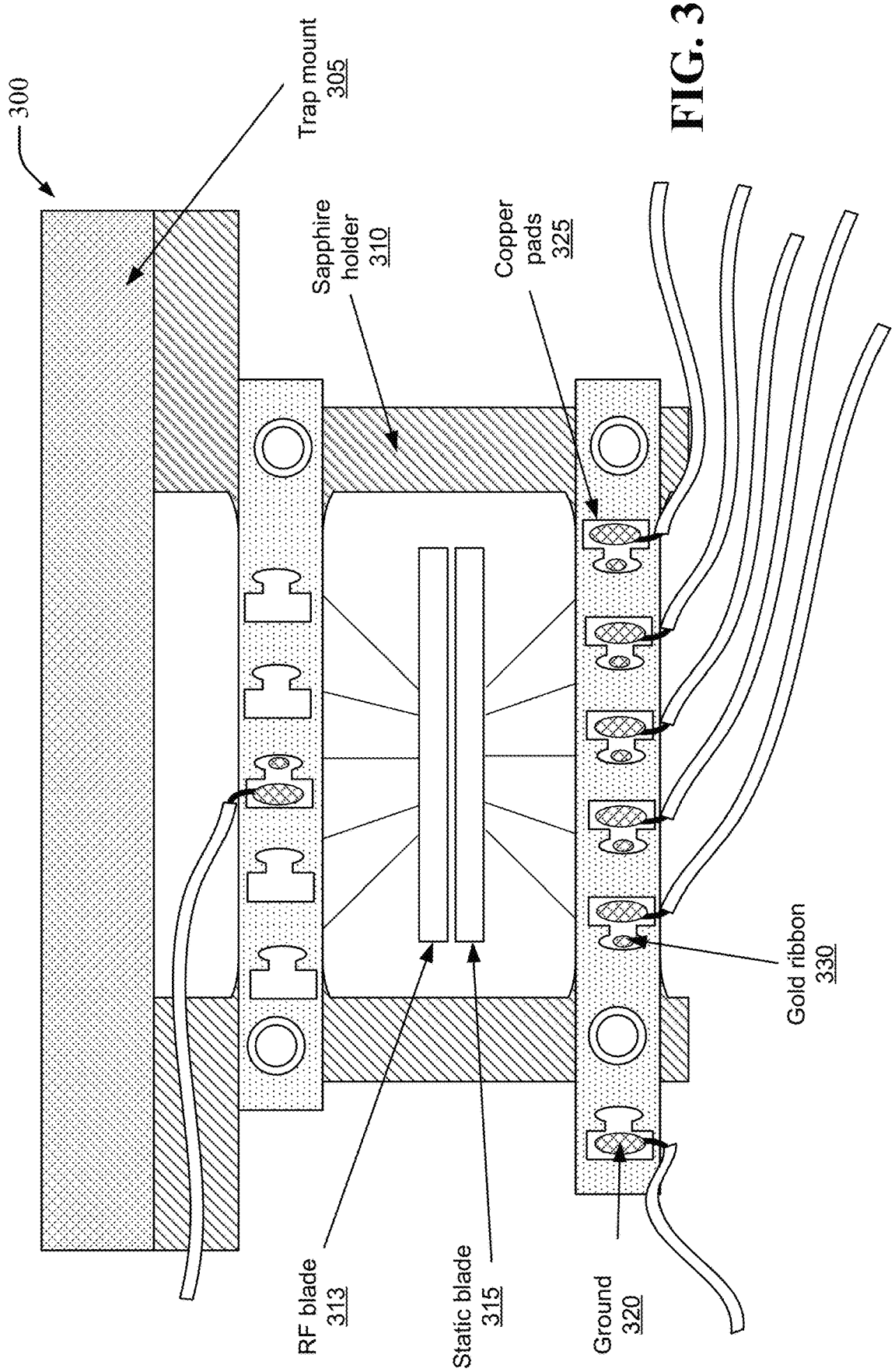
FIG. 3 is a diagram that illustrates an example of a blade ion trap in accordance with aspects of this disclosure.

The blade trap example in this disclosure (e.g., blade trap 180) is hand-assembled and aligned under a microscope with 5 µm resolution. In an example shown in FIG. 3, the blade trap may have a trap mount 305 to which a sapphire holder 310 is attached. Also shown are copper pads 325, gold ribbons 330, ground 320, and RF blades 313 and static blades 315. The blades are made of alumina and have five segments. They have been cleaned with HF (hydrofluoric acid) and plasma ashed on both sides, then coated with a 100 nm titanium adhesion layer and a 1 µm gold layer at Sandia Laboratories. The two static electrode blades are gold coated with masks so that the five segments can be biased independently, whereas the RF blades have an unsegmented coating. In an example, five (one) 0.015" wide and 0.001" thick gold ribbons are wire-bonded on top of the static (RF) blades for electrical connections. In order to shunt RF pick-up voltages on the static blades, an 800 pF ceramic capacitor has been soldered on each of the gold ribbons. The capacitors (DIGIKEY 399-11198-1-ND) are made of NPO, which has a low dielectric constant so that the capacitance is temperature insensitive down to 4 K. The capacitors are soldered onto the gold ribbons (e.g., gold ribbons 330) as there may not be capacitors readily available made of low dielectric constant material that could be wirebonded directly to the gold ribbon. Standard solder is cryo-compatible so it is used to connect the other end of the gold ribbons to the external copper pads (see e.g., copper pads 325 in FIG. 3) for wiring instead of using the invasive spot-welding procedure usually followed for UHV blade traps. The blades are mounted on a sapphire holder (e.g., sapphire holder 310) in a 60°/30° angle configuration, which allows good optical access both in the x-y plane and along the vertical z direction. The distances between the electrodes tips are approximately 340 µm/140 µm and the ion-electrode distance is 180 µm. The x-y plane features 0.1 NA through the eight 1" windows, which are used for Doppler cooling, detection, optical pumping (369 nm), photo-ionization (399 nm), repumper (935 nm) and Raman (355 nm) laser beams. High-resolution imaging can be performed along the vertical z direction (see e.g., FIG. 1(b)) since there is a 3.5 cm working distance on a 2" window, allowing for an objective of up to 0.5 NA.

As noted above, FIG. 3 shows, in a diagram 300, an example that illustrates a blade ion trap. The blades 313 and 315 are mounted on the sapphire holder 310 and gold ribbons 330 are wirebonded on top of them. The connection between the gold ribbons and the kapton wires is provided by the copper pads 325 printed on Roger 4350B printed circuit board (PCB).

In order to provide eV-deep trapping potentials and high trap frequencies, the blade trap needs to be driven with hundreds of Volts in the radio-frequency (RF) range. Based on the COMSOL simulation model of the blade trap, there is a need of about $V_{RF}$=600 V amplitude to get a $\omega_{tr}$=2 $\pi$×5 MHz transverse trap frequency with a RF drive at $\omega_{rf}$=2 $\pi$×24 MHz. Considering the calculated trap capacitance $C_t$=1.5 pF, the power dissipated on the blades can be estimated to be $P_d$=½$\Omega_{rf}^2 C_t^2 V_{RF}^2 R_t$≈1 mW; where $R_t$ is the resistance of the 1 µm gold layer on the blade, which is estimated considering that the gold skin depth decreases from $\Delta\omega_{rr} \neq 15$ µm at 300 K to 250 nm at 4 K. Moreover, the blades are efficiently heat sunk, as they are mounted on a holder made of sapphire, which presents the double advantage of a better thermal conductivity compared to macor or alumina holders and a well matched coefficient of thermal expansion with the alumina blade substrate.

C. Helical Resonator

A helical resonator (e.g., helical resonator 165 in FIG. 1(*b*)) enables impedance matching between a radiofrequency source and the trap by acting as a step-up transformer. The parasitic capacitance and inductance of the 70 cm of coaxial RF transmission cable in between the vacuum feedthrough and ion trap would make the impedance matching of the tuned resonator and trap circuit very difficult, thereby limiting the RF voltage that could be delivered to the trap. Therefore, the apparatus is configured to host the helical resonator in the 4 K region as close as possible to the blade trap (see e.g., FIG. 1(*b*)).

Inside the helical resonator, there is wound a bifilar coil whose two components are connected to the two RF blades. In this way, each blade can have an independent static potential offset. The two coils are held in place by teflon holders and they are shorted at RF with a 400 nF capacitor. The resonator is made of solid copper with a 2.3" inner radius, whereas the bifilar coil features a 1.5" radius and a 0.19" pitch. Inserted inside the resonator is a capacitive 100:1 pick-o of the RF voltage that is used to monitor and actively stabilize the transmitted voltage amplitude to the trap blades. The self-inductance Lres=2µH and self-capacitance Cres=8 pF have been measured loading the resonator with different test-capacitors.

At room temperature the resonator quality factor is Q =1050, where Q is defined as:

$$Q = \frac{2Q_{load}}{1 - \sqrt{R}}, \quad (1)$$

where R is the reflected RF power due to impedance mismatch (see e.g., FIG. 4) and $Q_{load}=\Omega_{rf}/\text{FWHM}$ is the loaded Q-factor, which takes into account the response of the helical resonator connected to the blade trap. The resonator is inductively coupled with a small 0.5" diameter antennacoil, whose position can be tuned to reach critical coupling. At 4 K, the resistance of the whole RF circuit is reduced and two effects take place: the impedance matching condition changes and the Q value at critical coupling increases up to 3170 (see e.g., FIG. 4). The 60% increase in the resonator quality factor is lower than what would be expected from a simple estimate based on the decrease of copper resistivity and skin depth at 4 K. This is likely explained by oxide layers on the copper surface or by the additional resistance contribution of solder connections in the resonator. In order to compensate the temperature induced resistance change, the mutual inductance between the antenna and the bifilar coil may be reduced by pulling out the antenna holder (see FIG. 1(*b*)). During the cool-down, the drive frequency $\Omega_{rf}/2\pi$ increases typically by 0.6%, which is explained by the reduction in resonator self-capacitance and self-inductance induced by thermal contraction of the copper.

Figure 4:
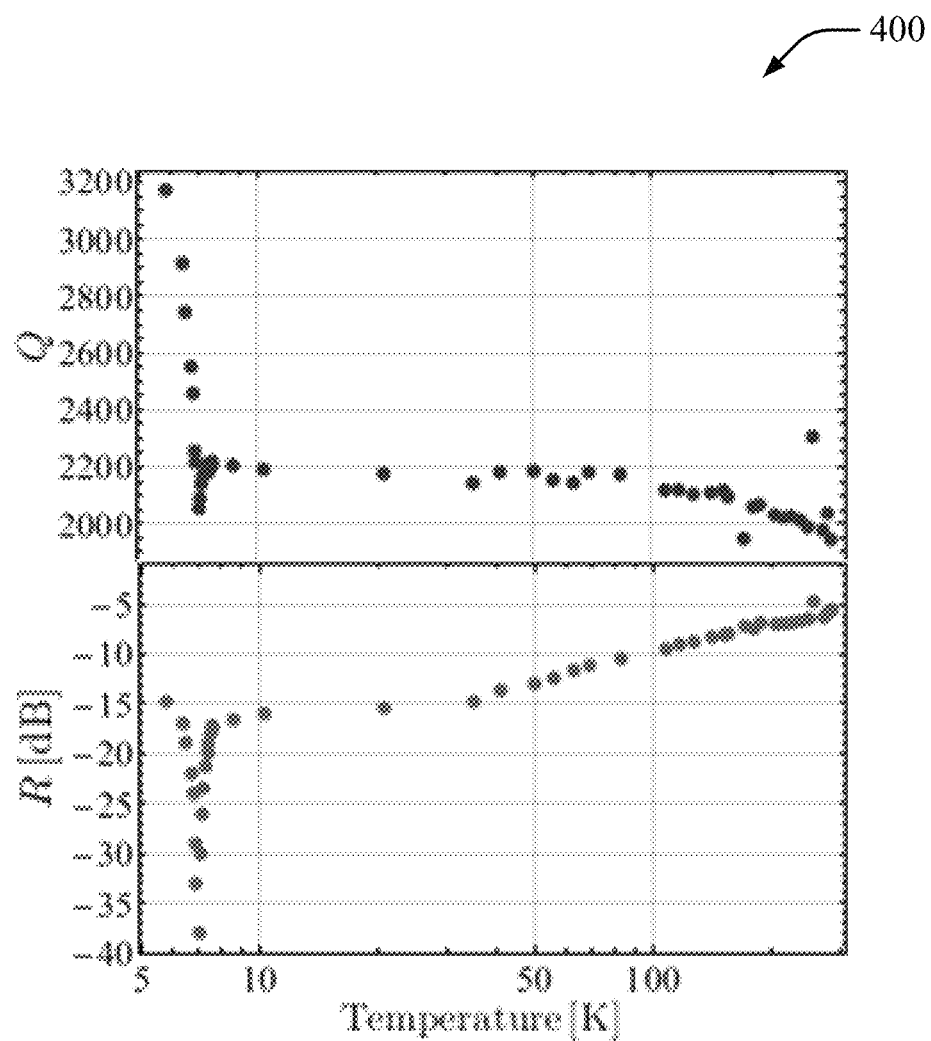
FIG. 4 is a diagram that illustrates an example of a resonator Q-factor and radio frequency (RF) reflected power as a function of temperature in accordance with aspects of this disclosure.

FIG. 4 shows a diagram 400 illustrating a resonator Q-factor and RF reflected power as a function of the temperature. The steep variation at low temperatures is due to the sharp decrease in the copper resistivity below 100 K, whose effect is delayed as the bifilar coil is in poor thermal contact with the copper can. The loaded quality factor Qload (described above) increases from 210 up to 900 during the cool-down.

D. Atomic Source

In order to load the ions in the blade trap the atomic source has been resistively heated up, which is incased in a 0.5" long stainless steel (SS) tube with a tantalum wire spot welded to each end. The oven (see e.g., oven 170 in FIG. 1(*b*)) is supported by a macor holder, made of two 0.5" ID halves enclosing the SS tube to ensure stable pointing. In an implementation there were two ovens in the 4 K region attached to the trap mount, one with isotopically enriched $^{171}$Yb and the other with natural abundance Yb. The ovens were initially placed as close as possible to the trap and the macor holders had the purpose to create a thermal short between the ovens and the trap mount at 4 K. However, the heat load coming from the ovens was enough to make the whole copper structure expand more than the trap clearance, requiring the Doppler cooling beam to be steered accordingly for trapping. Moreover, the whole ramp up of the ovens had to be done gradually as the thermal gradients could break the tantalum wires, resulting in a total average loading time of 1 h and 30 min.

For these reasons, the atomic source is moved to the room temperature sector of the vacuum apparatus (see e.g., FIG. 1(*b*)). The oven is in a 2.93" long UHV bellow so that under vacuum the atomic source may be approximately 11.9 cm away from the trap. The atomic beam direction is aligned on the trap axis (x) to minimize the exposure of the electrode gaps. This prevents shorts or the formation of ytterbium oxide layers on the blades when the system is vented. The oven's macor holder sits on an aluminum bar which is screwed down to the feedthrough of the bellow and whose height is designed to match the trap axis location when the apparatus is cold (see FIG. 1(*b*)). The use of the bellow was originally intended to enable one to steer the atomic beam to maximize the loading rate, but the alignment by design was enough to provide a satisfactory loading rate. The generation of the atomic flux is achieved by the Joule effect, dissipating 1.5 W on the 0.22 Ohm oven resistance. With this setting, it is possible to load in approximately 4 minutes (including oven warm-up time) about 50 ions by using 2 mW of 399 nm and 350 mW of 355 nm laser light to perform a two-step photoionization process.

Figure 5:
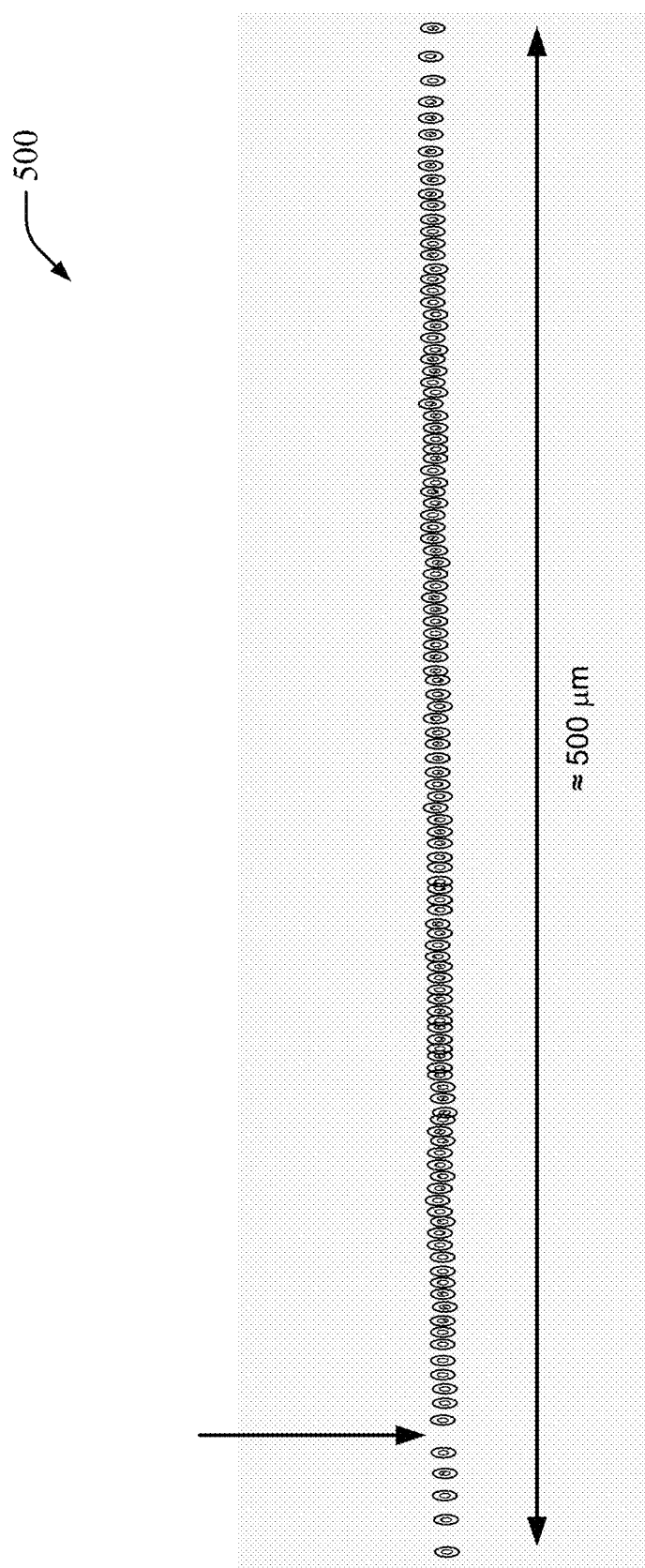
FIG. 5 is a diagram that illustrates an example of a linear chain of $^{171}$Yb$^+$ ions in accordance with aspects of this disclosure.

FIG. 5 shows a diagram 500 with an illustrative example representative of a linear chain of 121 $^{171}$Yb$^+$ ions. In this case $\omega_x/2\pi$=1.5 MHz and $\omega_x/2\pi$=35 kHz. The axial confinement has been relaxed to resolve all the center ions with a 0.1 NA objective. In order to fit the whole chain in a CCD camera, two images are taken of the left and right part of the chain by moving the objective along the trap axis. There is only one dark ion in the $^2F_{7/2}$ state on the left part of the chain, indicated by an arrow.

III. Vibration Isolation System

Figure 6A:
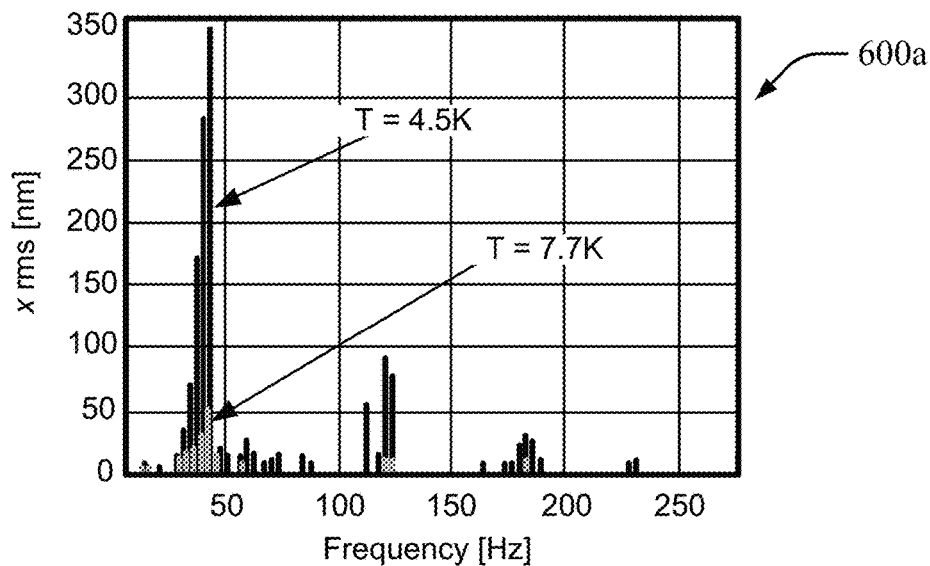
FIGS. 6(a), 6(b), and 6(c) are diagrams that illustrate examples of vibrations along the three trap principal axes in accordance with aspects of this disclosure.
Figure 6B:
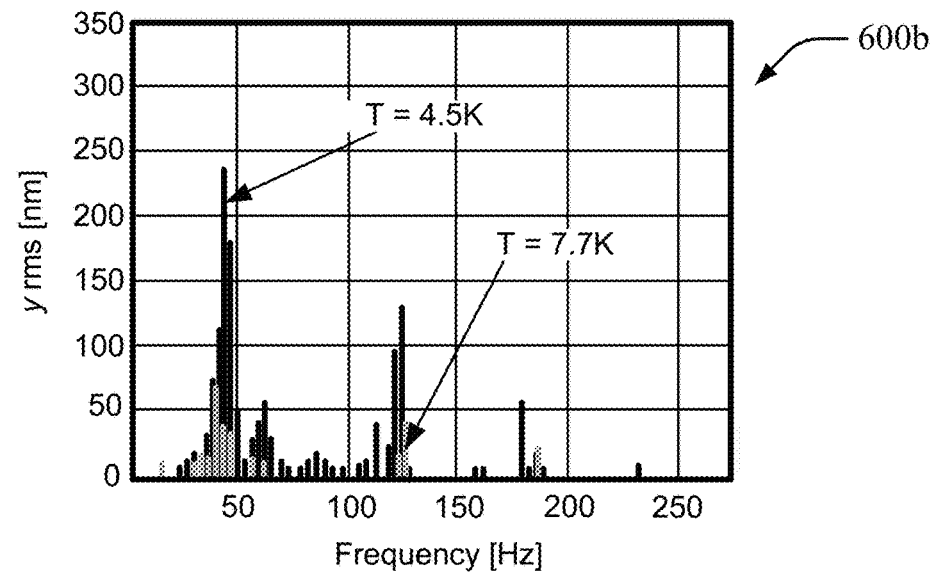
Figure 6C:
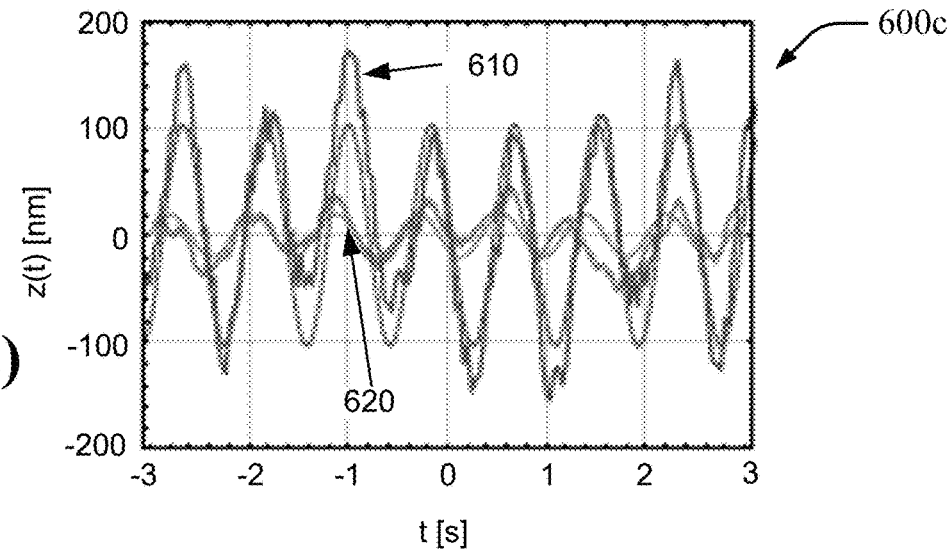

FIGS. 6(*a*), 6(*b*), and 6(*c*) show diagrams 600*a*, 600*b*, and 600*c*, respectively, illustrating vibrations along the three trap principal axes. In FIGS. 6(*a*) and 6(*b*): in-plane x-y vibrations for different trap mount temperatures T=4.5 K (dark lines) and T=7.7 K (gray lines). Rms amplitudes along x(y) are reduced by a factor of 5(6) respectively by raising the temperature of the cryostat above the helium boiling point. The RBW is 0.1 Hz. In FIG. 6(*c*): vertical vibration induced by the cryostat fitted with a sine at 1.2 Hz frequency (superimposed on the data samples). The line 610 refers to the vibrations before improving the static support of the breadboard, yielding a 40 nm peak-to-peak (pk-pk) oscillations, while the line 620 refers to the vibrations after.

Figure 7:
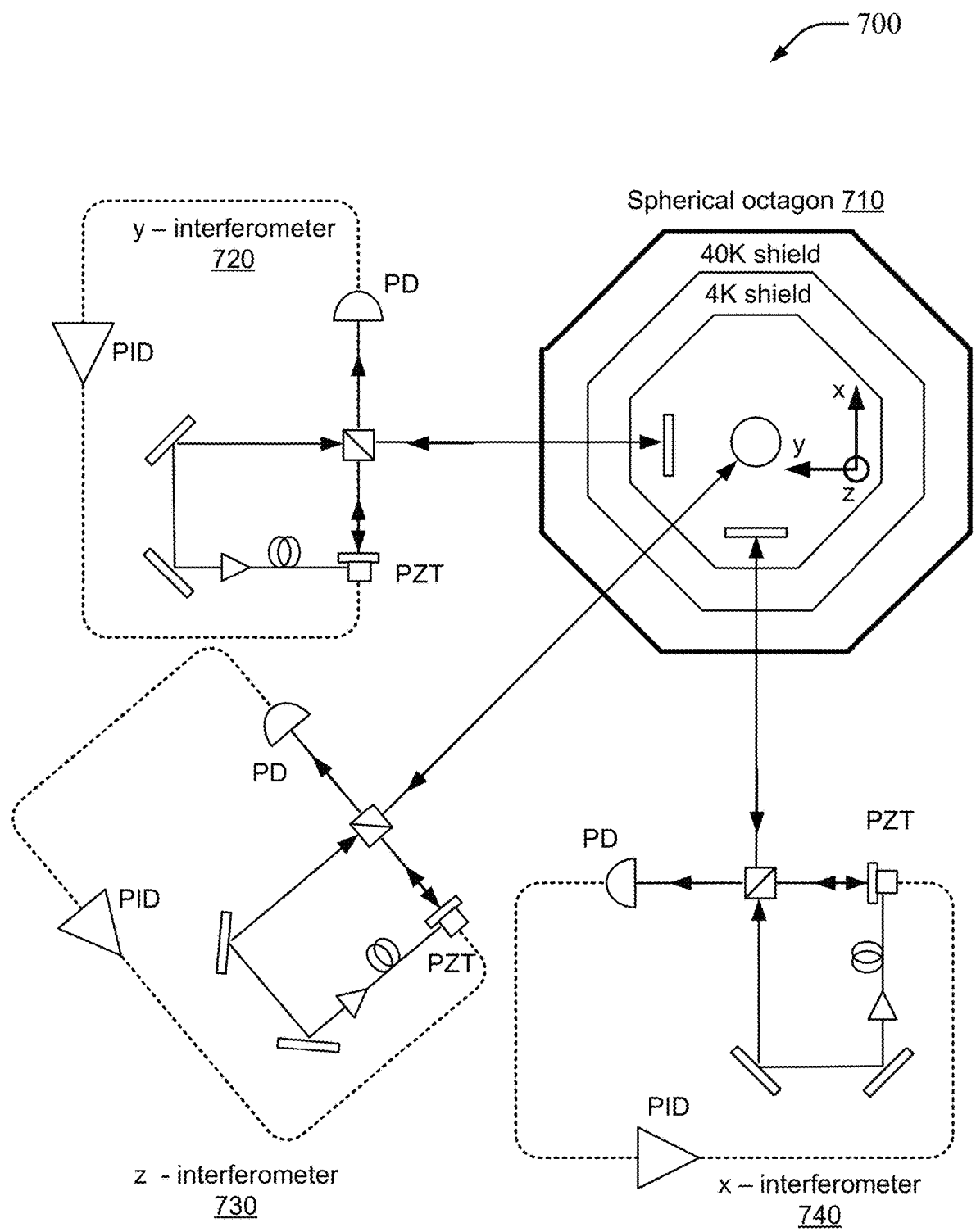
FIG. 7 is a diagram that illustrates an example of an interferometric setup for vibration measurement in accordance with aspects of this disclosure.

FIG. 7 shows a diagram 700 illustrating an interferometric setup for vibration measurements. The setup includes three mirrors are mounted inside the cryostat and attached to the trap mount along the three principal axes of the trap. Three different fibers deliver laser light to three interferometers with piezo-mounted mirrors (PZT) which lock the photodiode signal to a fringe with a feedback loop. The PID voltages output to the piezos compensate for vibrations and are used to monitor their amplitude and frequency. The diagram 700 shows a spherical octagon 710 with 40 K shield and 4K shield (see e.g., FIG. 1(*a*)), as well as the three interferometers: y—interferometer 720, z—interferometer 730, and x—interferometer 740.

Since the Gifford-McMahon cold head compression and expansion cycles produce a significant amount of acoustic vibrations, it is crucial to assess and improve the performance of the vibration isolation system (VIS), which consists of an exchange gas region filled with helium gas, to provide a thermal link between the vibrating cold head and the cold finger. A rubber bellow (see e.g., rubber bellow 110 in FIG. 1(*a*)) is the only mechanical connection between the cold head and the lower part of the apparatus and acts as a vibration damper. Both the timescale and the amplitude of the residual acoustic vibrations are of interest in this case. In some implementations, quantum simulation experiments lasting up to 10 ms are to be performed, for example, creating spin-spin interactions through stimulated two-photon Raman processes driven by a pulsed laser at λ=355 nm. Therefore, any ion chain displacement (e.g., movement as a result of vibration) larger than λ during the laser interaction time would result in an unwanted phase shift experienced by the ions.

In an aspect, the mechanical stability of the whole apparatus is characterized by interferometric measurements. The trap is removed and three mirrors are placed on the trap mount, along the three principal axes: the Raman direction y, the trap axis x and the vertical imaging direction z (see FIG. 7). In this way, every movement of the trap region with respect to the breadboard and the table can be measured with a few nanometers resolution. In order to reliably assess the displacement of the trap by counting the number of fringes induced by the acoustic vibration, three piezo-mounted mirrors (PZT) are used on the reference path of the Michelson interferometers to lock the interferometer to a fringe (see FIG. 7). The servo loops have 1.8 kHz bandwidth and therefore they can fully compensate acoustic noise over the frequency range of interest (up to 300 Hz). The voltage-to-distance conversion of the piezo-mounted mirrors has been characterized on a static interferometer. In this way, the output voltages applied to the piezos are a direct measurement of the displacement of the trap mount along the three principal axes of the trap.

Figure 8A:
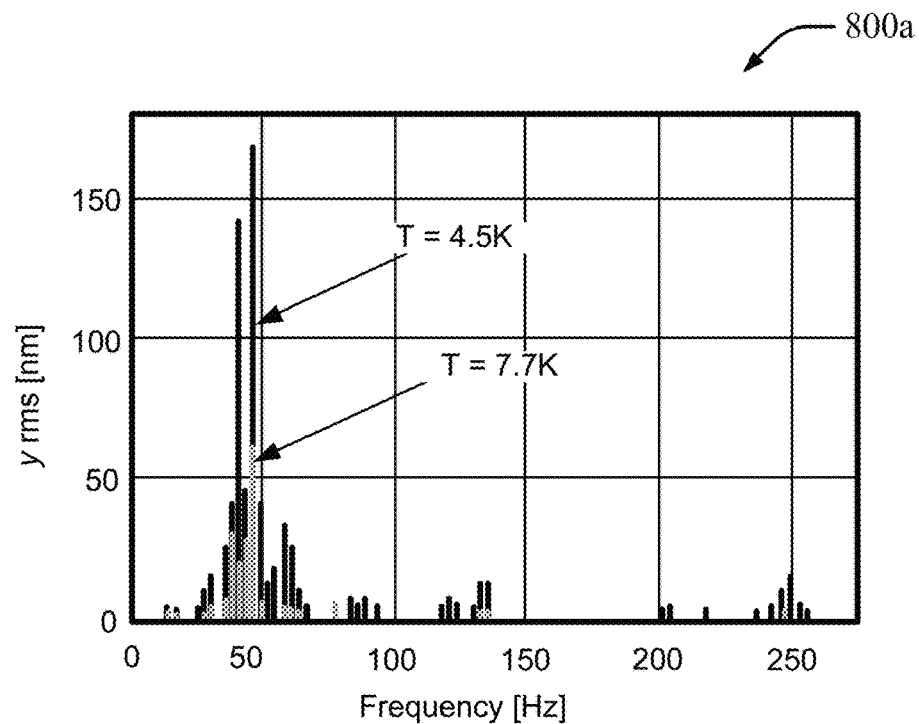
FIGS. 8(a) and 8(b) are diagrams that illustrate an example of improved vibrations along they axis in accordance with aspects of this disclosure.
Figure 8B:
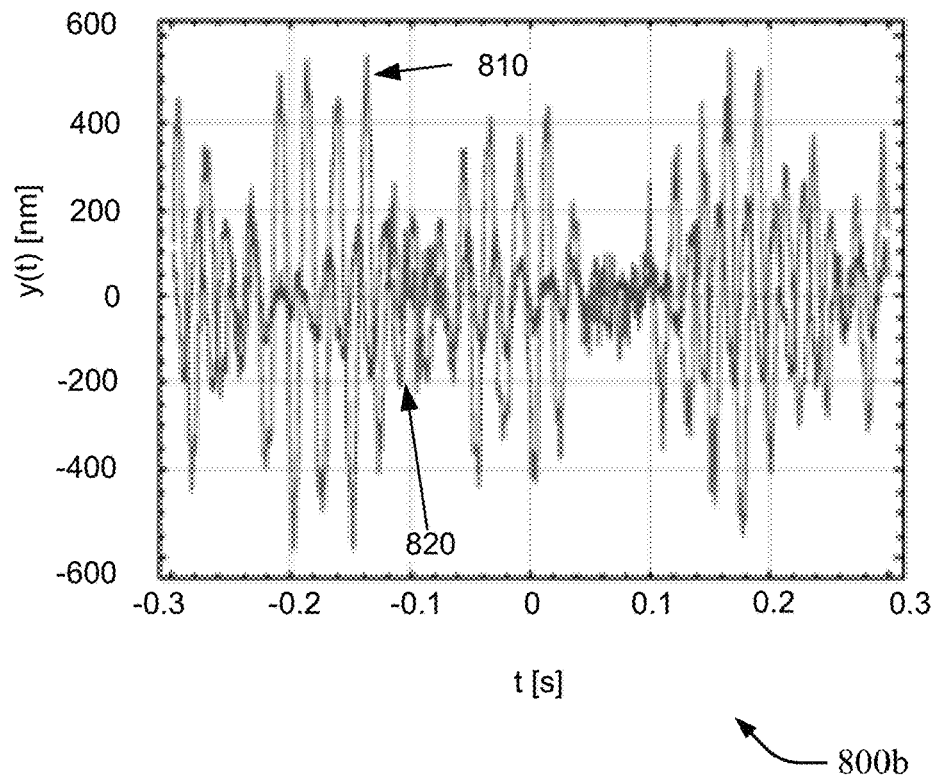

In the x-y plane, it is observed that the main contribution is given by a peak around 40 Hz, which is attributed to the normal mode of the cryostat 60 cm long lever arm. Finite element analysis suggests that the vibration modes at higher frequencies (120 Hz and 282 Hz peaks) are to be attributed to the mechanical structure inside the 4 K shield, made up of the resonator and the trap mount. It is noticed that most of these vibrations are driven by the vibrating cold head through liquid helium condensed at the bottom of the exchange gas region at the lowest operating temperature (see FIG. 1(*b*)). This condensation results in a reduced performance of the VIS, which can be overcome by heating up the 4 K stage and operating above the He boiling point. With the 4 K stage at T=7.7 K, the rms displacements in both the x and y directions are reduced by a factor of approximately 5, as shown in FIGS. 6(*a*) and 6(*b*). The vibration modes above 100 Hz are the most problematic ones as they are on a similar timescale of a typical quantum simulation experiment. In order to eliminate these higher frequency modes, we strengthened the resonator static support, making the whole 4 K structure stiffer. By doing so, it is possible to suppress the higher frequency modes by more than an order of magnitude (see FIG. 8(*a*)). This leaves only two very well defined normal modes at 39 Hz and 45 Hz, as shown in FIG. 8(*b*), which have been also suppressed with respect to FIG. 6(*b*). These lower frequency vibration modes constitute a manageable problem for our typical experiment or computation duration as spin-echo schemes can be applied to compensate the unwanted 40 Hz phase variation. In addition, a permanent mirror holder compatible with the trap may be used in order to monitor in real time the vibrations along the Raman y direction. In this way it will be possible to compensate the unwanted phase shift via a feed-forward to the AOM phase or to an EOM in the Raman path.

FIGS. 8(*a*) and 8(*b*) show diagrams 800*a* and 800*b*, respectively, that illustrate improved vibrations along the y axis. In FIG. 8(*a*): After improving the resonator static support structure, the frequency modes above 100 Hz shown in FIG. 6(*b*) are suppressed by a factor of 10. The RBW is 0.1 Hz. In FIG. 8(*b*): A two frequencies sinusoidal fit results in 39 Hz and 45 Hz beatnotes are shown in lines 810 and 820. Raising the cryostat temperature above the helium boiling point reduces the rms vibration.

The mechanical stability along the vertical z direction is also considered, finding a very well defined oscillation at the cold head vibration frequency (1.2 Hz) with a peak-to-peak amplitude of 200 nm, as shown in FIG. 6(*c*). This is ascribed almost entirely to a vibrational mode of the whole breadboard on which the cryostat is sitting. Indeed, exactly the same oscillation is observed with the same interferometer using a mirror attached underneath the breadboard, instead of the mirror attached to the trap mount inside the cryostat. In order to reduce these slow oscillations, more static support can be added to the elevated breadboard and thus reduce the peak-to-peak amplitude to about 40 nm.

IV. Characterization of Cryogenic Vacuum

The background pressure requirements for ion trap experiments or computations are demanding primarily for two reasons. First, the ions interact with the residual neutral molecule gas with the long range $\sim r^{-4}$ potential, which increases the collision rate compared to e.g. neutral-neutral collisions rates, governed by Van-der-Waals $\sim r^{-6}$ potentials. Secondly, since the Paul trap is not static, the collisions with a bath of neutral particles can induce heating by displacing the ions diabatically with respect to typical RF timescales, depending on the mass imbalance and on the instantaneous RF phase at which the collision occurs. As a consequence of this instantaneous and random amplification of the ion motion, Doppler cooling becomes ineffective, the ion crystal melts and avalanche RF heating takes place, resulting in ion loss. The ion chain lifetime depends strongly on the Mathieu parameter $q \approx 2\sqrt{2}\omega_{tr}/\Omega_{rf}$ of the trap in consideration: once one ion is displaced by a collision, nonlinearity coming from the Coulomb repulsion will cause the ion's kinetic energy to grow at a rate that scales as a power law of q with an exponent greater than or equal to 4. The q parameter sensitivity is related to higher order terms in the RF trapping potential expansion beyond the first order quadrupolar contribution. These terms are associated with nonlinear resonances inside the stability region of a linear Paul trap that are likely to accelerate the ion loss once the crystal has melted.

It is possible to qualitatively estimate, from kinematic considerations, the energy acquired by an ion i at rest after an elastic collision with a background molecule with incoming energy $E_m$:

$$\Delta E_i = \frac{4\xi}{(1+\xi)^2} \sin^2(\theta_{sc}/2) E_m, \quad (2)$$

where $\xi = M_m/M_i$ is the mass-imbalance parameter and $\theta_{sc}$ is the scattering angle. However, it is possible to assume that, whenever a collision occurs, the dynamics is effectively one dimensional and $\theta_{sc} = \pi$. In both a room-temperature UHV system and a cryogenic apparatus, the residual background gas is made mostly of hydrogen molecules ($H_2$), the least efficiently cryo-pumped gas after helium, leading to $\xi = 0.011$ for $^{171}Yb^+$ ions. Considering the thermal energy of $H_2$ molecules $\langle E_{H_2} \rangle = 3/2 k_B \times 4.5$ K and averaging over all scattering angles, it is possible to obtain a mean ion energy increase of $\langle \Delta E_{Yb^+} \rangle = k_B \times 300$ mK per elastic collision.

In this cryogenic vacuum system, a catastrophic ion loss induced by collisions has not been observed, even for chains of above 100 ions at q=0.35. In the room temperature UHV experiment, with same q, the lifetime of a chain of about 50 ions is on average 5 minutes. The enhanced lifetime can be attributed to two factors: on one hand differential cryo-pumping allows to reduce the background pressure with respect to standard UHV systems, therefore reducing the overall collision rate. Secondly, even when a collision occurs, the average energy transfer $\langle E_{Yb^+} \rangle$ is about 60 times lower than in a room temperature UHV experiment and the crystal melting is less likely to happen as the Doppler cooling laser can efficiently recapture the ions and recrystalize them. In a UHV apparatus $\langle \Delta_{Yb^+} \rangle \approx k_B \times 10K$ for $H_2$ molecules, which, according to our numerical simulations, is not sufficient to displace the ions enough to melt the crystal. According to numerical simulations, these catastrophic collisions in a room temperature UHV system are most likely caused by rare collisions with heavier residual background gases ($N_2$, $CO_2$ and $H_2O$), that in a cryogenic system are completely frozen.

In order to quantify the background pressure in the vacuum system, a hot cathode ionization gauge may not be used as it can generate additional gas load. Moreover, the gauge in use measures the pressure of the room temperature vacuum region, which is on the order of low $10^{-9}$ Torr when the apparatus is cold. Since both the 40 K and the 4 K cryogenic regions are not vacuum sealed, it is difficult to estimate the differential cryopumping between the room temperature region and the inner part of the apparatus. For this reason, the ion crystal is used as a pressure gauge by measuring collision rates with the molecular hydrogen background gas as a function of the cryostat temperature.

The ion-neutral molecule interaction is described by a $\sim r^{-4}$ potential, stemming from the interaction between the charge e of the ion and the induced electric dipole moment of the molecule with static polarizability:

$$U(r) = -\frac{\alpha}{2} \frac{e^2}{4\pi\epsilon_0 r^4} = -\frac{C_4}{r^4}. \quad (3)$$

It is possible to safely assume the validity of the classical Langevin model with no quantum corrections, since the average energy of the incoming $H_2$ molecule $\langle E_{H_2} \rangle$ is much larger than the p-wave centrifugal barrier associated with the potential (3), which can be approximated as $$E_4 = \hbar^2/2 \; \mu R_4^2 \approx k_B \times 3 \text{ mK},$$

with $$R_4 = (2 \; \mu C_4/\hbar^2)^{1/2}$$

and $\mu$ the reduced mass.

In the Langevin model the collision rate is independent of the energy of the incoming particle and it is directly proportional to the density, or equivalently to the pressure assuming the ideal gas law. This results in:

$$\gamma = \frac{P}{k_B T} \frac{e}{\epsilon_0} \sqrt{\frac{\alpha_{H_2}}{\mu}} \quad (4)$$

In order to estimate the residual background pressure inside the cryostat, it is possible to measure the rate at which dark ions are produced. Indeed, whenever a collision occurs, there is a finite unknown probability Pin that two inelastic processes take place: (a) optically excited ions $^{171}Yb'$ in the $^2P_{1/2}$ or $^2D_{3/2}$ states, both populated by the Doppler cooling light at 369 nm, are subjected to collisional quenching that leads to population trapping in the metastable $^2F_{7/2}$ state; and (b) molecule association: an optically excited ion has enough energy to chemically react with H2, breaking its bond and forming an ytterbium hydride (YbH$^+$) molecule. In both cases the ions stop scattering Doppler cooling photons and appear as missing in the ion chain as imaged on an EMCCD camera (Andor iXon 897). Therefore, it is possible to extract a relative measurement of the pressure by recording the occurrence rate of dark ions, namely $\gamma_{in} = P_{in} \gamma$. The dark ion rate is measured as a function of the temperature of the cryostat (see e.g., FIG. 9) observing an increase by an order of magnitude, with a temperature increase of 5.5 K. By comparing the dark ion rate in the cryogenic vacuum system with the room temperature UHV system with a gauge-measured pressure of $1 \cdot 10^{-11}$, from which it can be inferred the residual background pressure as:

$$P_{4K} = P_{300K} \frac{\gamma_{in}^{(300K)}}{\gamma_{in}^{(4K)}} \frac{k_B T_4}{k_B T_{300}}. \quad (5)$$

With this method, it is possible to estimate $P_{4K} < 10^{-12}$ Torr.

Figure 9:
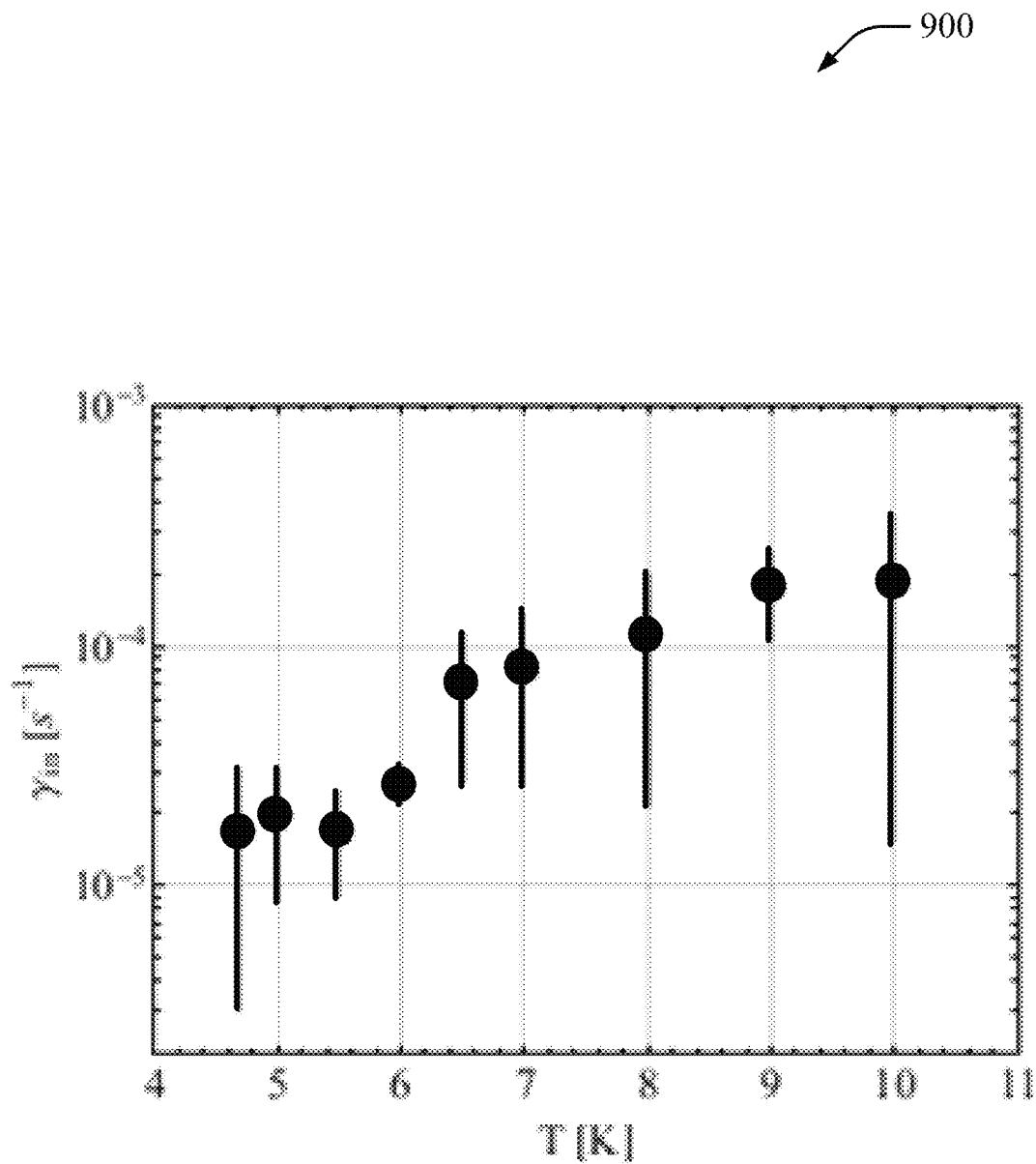
FIG. 9 is a diagram that illustrates an example of an average dark ion rate as a function of temperature in accordance with aspects of this disclosure.

FIG. 9 shows a diagram 900 that illustrates an average dark ion rate as a function of temperature. The data have been acquired with 33 ions for a time period varying from 12 hours to 3 hours. The reported inelastic rate is per ion. The error bars are standard deviation of each data set. The size of the error bars is caused by the poor statistics, due to the rare occurrence of inelastic collision processes.

Figure 10:
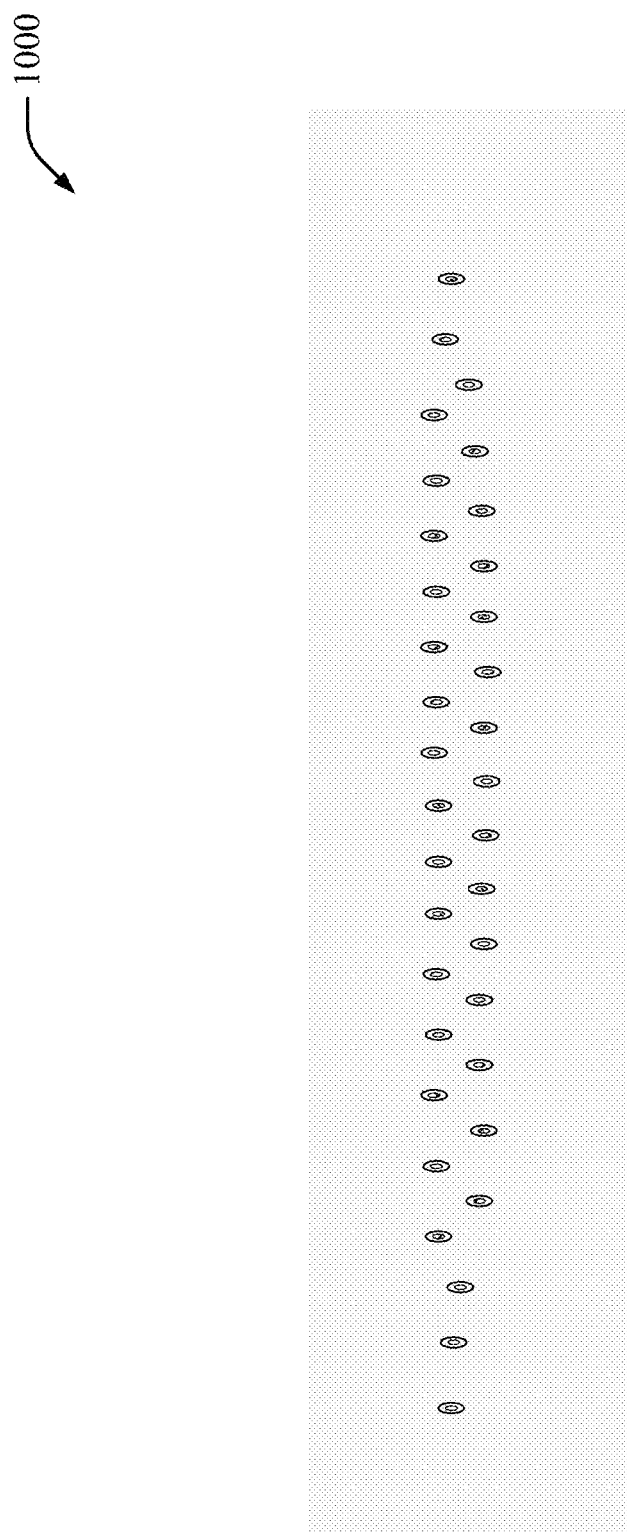
FIG. 10 is a diagram that illustrates an example of a zig-zag ion chain in accordance with aspects of this disclosure.

In order to measure the pressure, also considered is the rate of reconfiguration events yet caused by elastic collisions when N ions are in a zig-zag configuration, namely when $\omega_{y,z}/\omega_x < N/\sqrt{\log(N)}$, where $\omega_{y,z}$ are the two transverse frequencies and $\omega_x$ is the axial frequency (see FIG. 10). When this condition is met, there are two degenerate configurations separated by a small energy gap, which depends on the transverse mode splitting $\Delta\omega_{tr} = \omega_z - \omega_y$. When an elastic collision occurs, the ions have a finite probability to switch from the "zig" to the "zag" configuration, if the energy gained by the ions is enough to overcome the barrier. Therefore, our observable is $\gamma_{el}=p_{flip}\gamma$, where $p_{flip}$ is the probability of flipping the zig-zag chain, which is a function of the transverse mode splitting $\Delta\omega_{tr}$ and of the energy of the incoming particles. In order to calculate $p_{flip}$, a numerical simulation has been performed of 31 ions in a Paul trap after a collision with a $H_2$ molecule with mean energy $\langle E_{H_2}\rangle 3/2k_BT$ over $2\times10^4$ RF periods, calculating the probability dependence on the temperature and on the energy barrier. The elastic rate yet has been measured at $\Delta\omega_{tr}=2\pi\times2$ kHz at two different temperatures (T=4.7 K and the T=7 K). By inverting Eq. (4) and using the calculated $p_{flip}$ values, the pressure has been measured to be $P=(2\pm2)\cdot 10^{-12}$ Torr and $P=(4\pm2)\cdot 10^{-12}$ Torr for T=4.7 K and 7 K, respectively. Both measurements are in reasonable agreement with the pressure estimate coming from the inelastic rate measurement.

FIG. 10 shows a diagram 1000 that illustrates a zig-zag ion chain. In this example, the zig-zag chain with N=35 ions with $(\omega_x, \omega_x, \omega_x)=2\pi\times(67, 613, 632)$ kHz.

V. Uniformly Spaced Ion-Chains

The segmented blade trap features 10 static electrodes which allow for the realization of axial anharmonic potentials. In particular, quartic axial potentials have been shown to offer several advantages in handling, cooling and performing coherent operations on large ion chains. Such potentials relax the conditions necessary to achieve a linear configuration of the ion chain, avoiding zig-zag transitions at the center of the chain. At the same time, tailored anharmonicity in the axial potential allows us to minimize the ion spacing inhomogeneity induced by the Coulomb repulsion and enables control of the average spacing between the ions. In addition, a homogeneous spacing configuration prevents the ions in the chain center from coming too close to each other, which reduces cross-talk in ion state detection and single ion manipulation with focused laser beams. Finally, the anharmonic potentials can be used to shape the normal mode structure and to minimize the inhomogeneity in the laser-induced spin-spin coupling by shaping the transverse normal-mode dispersion.

The form of the quartic axial potential induced by the static electrodes can be written as:

$$V_{ax} = \sum_{i=1}^{N} \frac{\alpha_2}{2}x_i^2 + \frac{\alpha_4}{4}x_i^4, \quad (6)$$

where $x_i$ is the position of the i-th ion and $\alpha_2=m\omega_x^2$, with $\omega_x$ the axial frequency and m the ion atomic mass. The axial equilibrium positions are determined by the balance between the electrostatic axial forces ($F_{ax}=-\partial_x V_{ax}$) and the inter-ion Coulomb repulsion:

$$0 = u_i + \beta u_i^3 - \sum_{j=1}^{i-1}(u_i-u_j)^{-2} + \sum_{j=i+1}^{N}(u_i-u_j)^{-2} \quad (7)$$

where $u_i=x_i/\ell$ is the i-th ion's position in adimensional units and $\ell=(q^2/4\pi\epsilon_0 m\omega_x^2)^{1/3}$ is the characteristic length of the axial potential, with $\epsilon_0$ the vacuum permittivity and q the electron charge. The quartic potential is characterized by the dimensionless ratio $\beta=\alpha_4\ell^2/\alpha_2$ which can be optimized to minimize the inhomogeneity of the ion chain. By solving equation (7), it is possible to find the optimal (N) (see e.g., FIG. 11(c)) for a certain ion number N, that minimizes the ion inhomogeneity which can be parameterized by the ratio $\sigma_{\Delta x}/\overline{\Delta x}$, where $\sigma_{\Delta x}$ and $\overline{\Delta x}$ are the ion spacing standard deviation and mean spacing, respectively. Once the optimal $\beta^*(N)$ is found, it is possible to fully determine the potential by choosing a desired average spacing $\overline{\Delta x}$, which depends on the absolute value of the harmonic frequency $\omega_x$. A particular choice of the quadratic term $\alpha_2^*$ determines the characteristic length $\ell(\alpha_2^*)$ and corresponds to a certain equilibrium average spacing $\overline{\Delta x}^*$. Therefore, the quartic component is univocally determined by the equation $\alpha_4=\beta^*\alpha_2^*/\ell(\alpha_2^*)$. In FIG. 11(a), it is shown how it is possible to obtain the minimum variance to mean spacing ratio (solid curves) by tuning the quartic potential, ranging from N=18 to N=44 ions in a linear configuration.

FIGS. 11(a), 11(b), and 11(c) show diagrams 1100a, 1100b, and 1100c, respectively, that illustrate uniformly spaced ion chains. FIG. 11(a): The spacing variance to mean ratio $\sigma_{\Delta x}/\overline{\Delta x}$ as a function of the number of ions in the linear chain. Data points are taken in the optimized electrode configuration resulting in a minimal inhomogeneity, which corresponds to the theoretical prediction for a quartic potential. The spacings value have been chosen according to practical considerations on the available electrodes voltages and on the CCD dimension sensors. FIG. 11(b): Ion chain with optimized spacing inhomogeneity for N=20, 28, 36, and 44 ions. A not-to-scale plot of the quartic potential for N=44 is shown as a guide to the eye. The error bars have been calculated propagating the Gaussian fit errors on the ions centers. FIG. 11(c): The spacing variance to mean ratio computed numerically for N=20, 28, 36, and 44 ions as a function of $1/\beta$, which characterizes the ratio between the quadratic and the quartic component.

Figure 12:
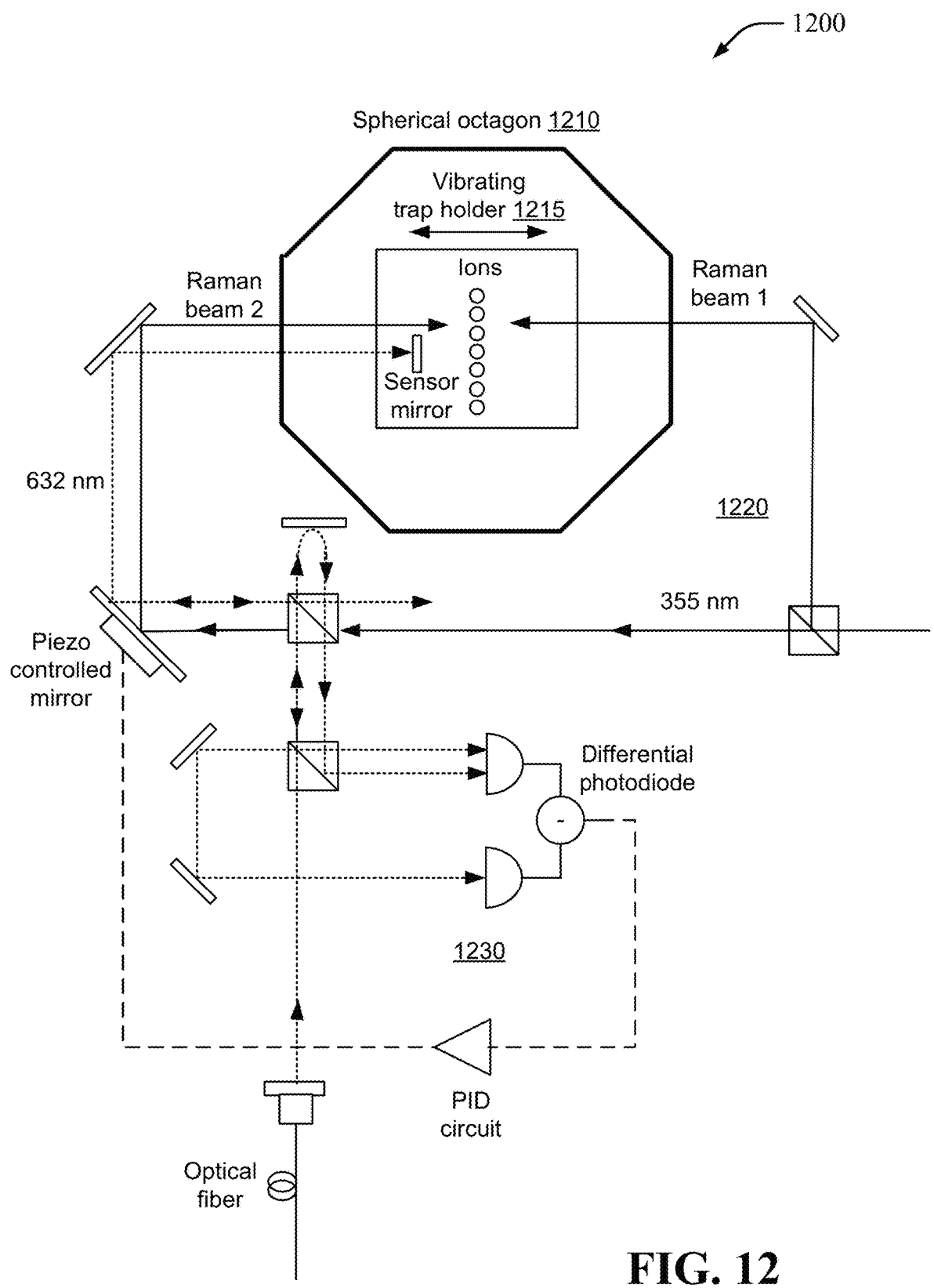
FIG. 12 is a diagram illustrating an example of a feedback technique to compensate for low frequency vibrations in accordance with aspects of this disclosure.

FIG. 12 shows a diagram 1200 illustrating an example of a feedback technique to compensate for low frequency vibrations. The basic idea illustrated in FIG. 12 is that an additional continuous-wave laser at 632 nm would sense interferometrically the vibrations of the ions bouncing off of a small mirror attached to the trap holder. This would be a real feedback that would allow to null completely the vibrations, not just a feed forward. The diagram 1200 shows a spherical octagon 1210, similar to the ones shown in FIG. 1(a) and FIG. 7, a vibrating trap holder 1215 that holds ions, a system 1220 that provides Raman beams 1 and 2 at 355 nm, and a system 1230 with various components (e.g., differential photodiode, mirrors, beam splitter, and PID circuit) to enable the feedback technique using the 632 nm laser light.

Figure 13:
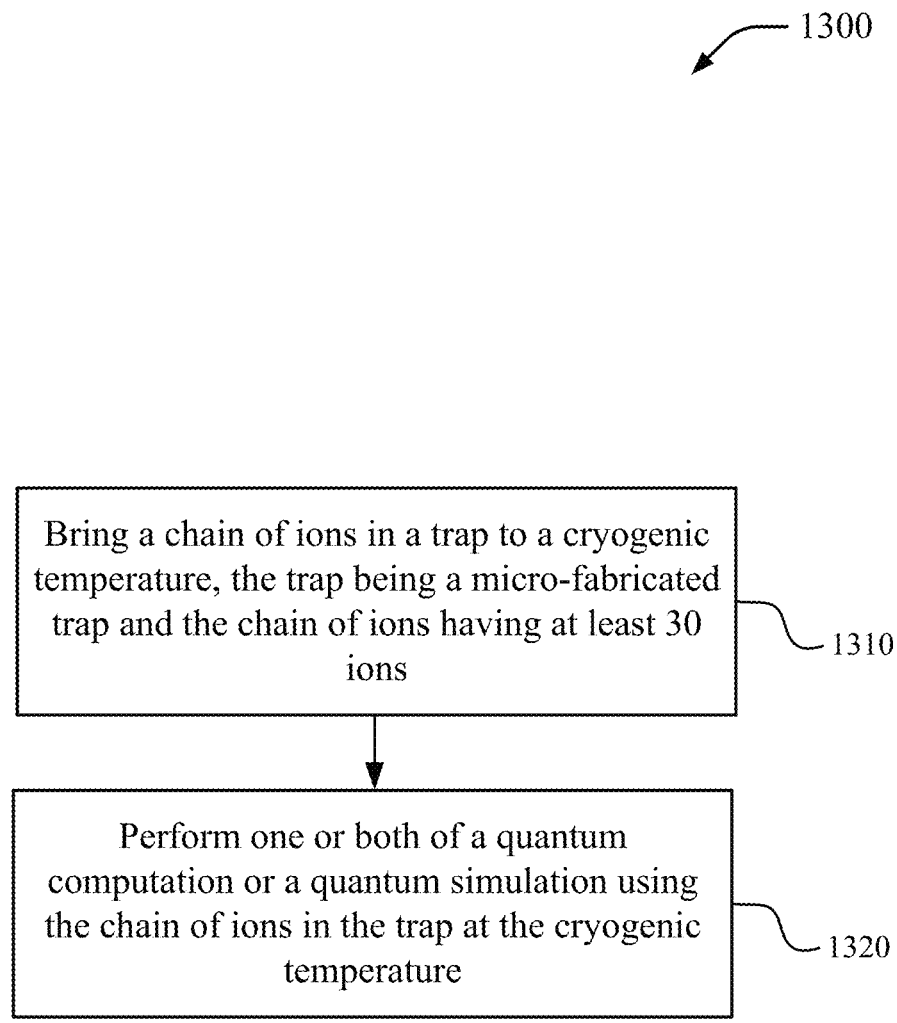
FIG. 13 is a flow diagram that illustrates an example of a method in accordance with aspects of this disclosure.

FIG. 13 is a flow diagram that illustrates an example of a method 1300. The method 1300 can be performed by any of the apparatuses described herein, including those described in FIGS. 16 and 17.

At 1310, the method 1300 for operating a trapped-ion system includes bringing a chain of ions in a trap at a cryogenic temperature, the trap being a micro-fabricated trap and the chain of ions having at least 30 ions. For example, a chain of ions may be provided, formed, enabled, or otherwise maintained in a trap in which at least the trap's electrodes are brought to a cryogenic temperature.

At 1320, the method 1300 for operating a trapped-ion system includes performing one or both of a quantum computation or a quantum simulation using the chain of ions in the trap at the cryogenic temperature.

In an aspect of the method 1300, the chain of ions having at least 30 ions includes the chain of ions having at least 40 ions, 50 ions, 60 ions, 70 ions, 80 ions, or 90 ions.

In an aspect of the method 1300, the cryogenic temperature is below 20 Kelvin, including temperatures at approximately 4 Kelvin.

Figure 14:
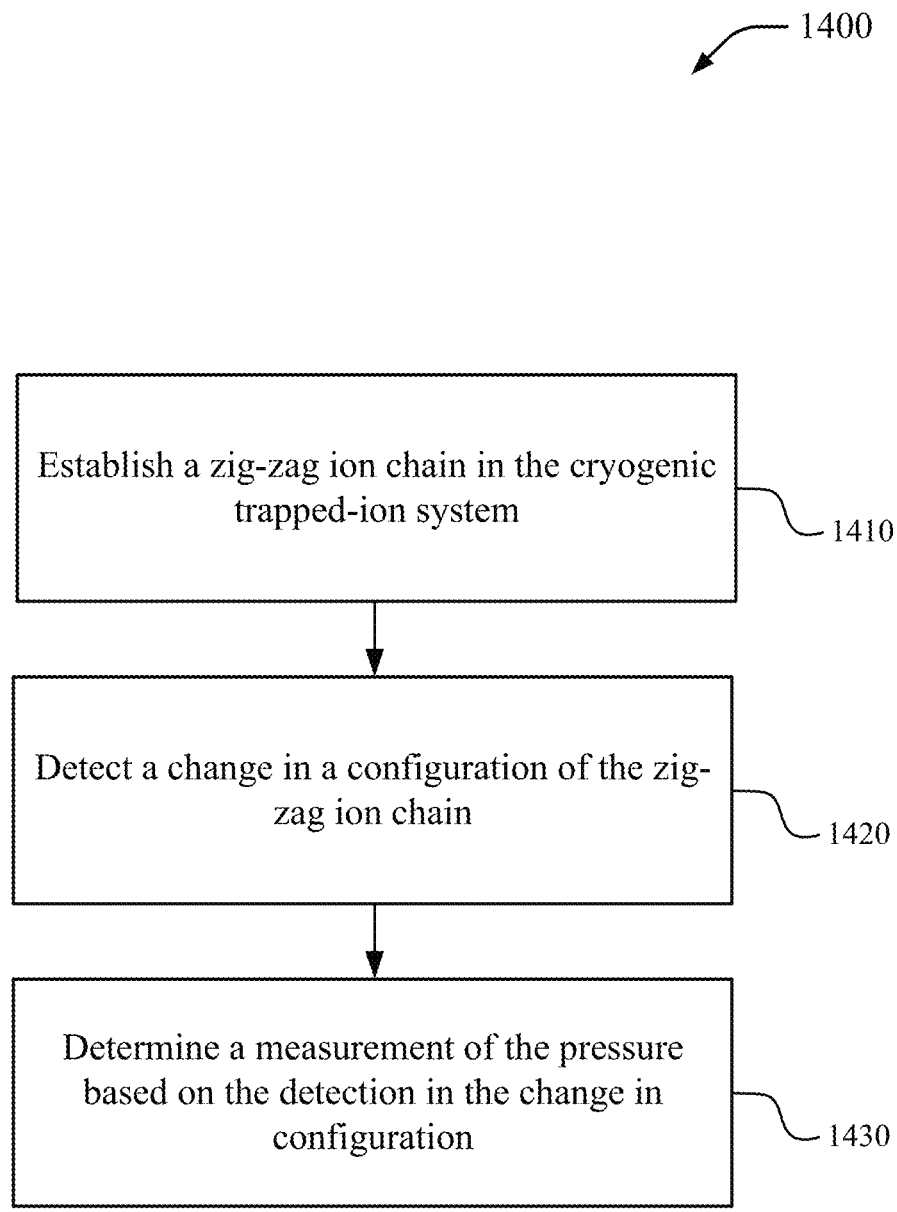
FIG. 14 is a flow diagram that illustrates an example of another method in accordance with aspects of this disclosure.

FIG. 14 is a flow diagram that illustrates an example of a method 1400. The method 1400 can be performed by any of the apparatuses described herein, including those described in FIGS. 16 and 17.

At 1410, the method 1400 for performing a pressure measurement in a cryogenic trapped-ion system includes establishing a zig-zag ion chain in the cryogenic trapped-ion system.

At 1420, the method 1400 for performing a pressure measurement in a cryogenic trapped-ion system includes detecting a change in a configuration of the zig-zag ion chain.

At 1430, the method 1400 for performing a pressure measurement in a cryogenic trapped-ion system includes determining a measurement of the pressure based on the detection in the change in configuration.

In an aspect of the method 1400, the change in configuration corresponds to a flip of the zig-zag ion chain from a "zig" configuration to a "zag" configuration.

In an aspect of the method 1400, determining the measurement of the pressure based on the detection in the change in configuration is based on a probability of flipping the zig-zag ion chain from a "zig" configuration to a "zag" configuration.

In an aspect of the method 1400, the change in the configuration of the zig-zag ion chain is in response to an elastic collision between the zig-zag ion chain and a residual background molecule or atom.

In an aspect of the method 1400, detecting the change in the configuration of the zig-zag ion chain includes detecting a rate of change in the configuration of the zig-zag ion chain, and determining the measurement of the pressure based on the detection in the change in configuration includes determining the measurement of the pressure based on the rate of change.

In an aspect of the method 1400, the zig-zag ion chain includes 30 or more ions.

In an aspect of the method 1400, establishing the zig-zag ion chain in the cryogenic trapped-ion system includes squeezing a linear ion chain so that it buckles in the middle, and loosening the squeezed ion chain without bringing it back to being fully linear.

Figure 15:
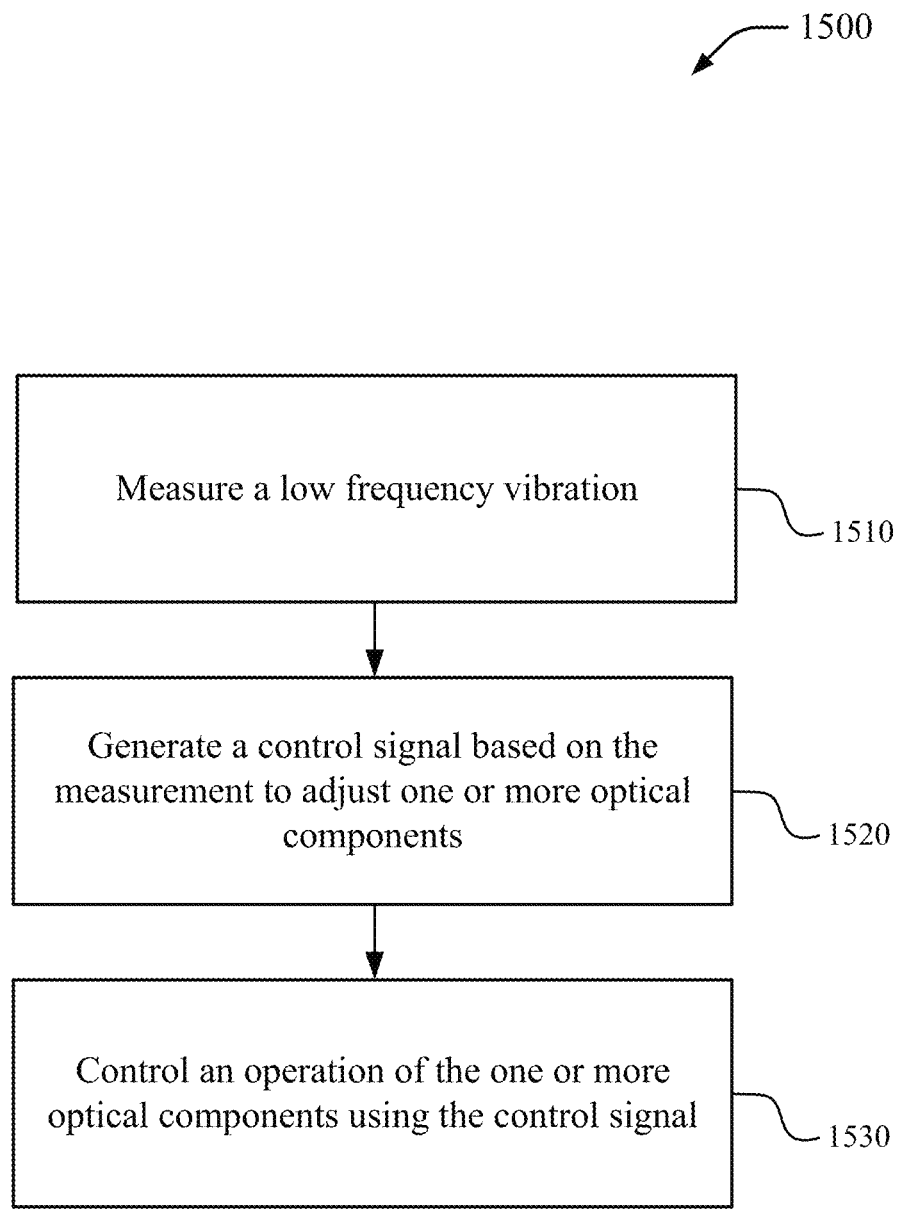
FIG. 15 is a flow diagram that illustrates an example of yet another method in accordance with aspects of this disclosure.

FIG. 15 is a flow diagram that illustrates an example of a method 1500. The method 1500 can be performed by any of the apparatuses described herein, including those described in FIGS. 16 and 17.

At 1510, the method 1500 to compensate for low frequency vibrations in a QIP system includes measuring a low frequency vibration.

At 1520, the method 1500 to compensate for low frequency vibrations in a QIP system includes. generating a control signal based on the measurement to adjust one or more optical components At 1530, the method 1500 to compensate for low frequency vibrations in a QIP system includes controlling an operation of the one or more optical components using the control signal.

In an aspect of the method 1500, measuring the low frequency vibration includes measuring vibrations using a Michelson interferometer.

In an aspect of the method 1500, generating the control signal includes generating a feedforward signal.

In an aspect of the method 1500, generating the control signal includes generating a feedback signal.

In an aspect of the method 1500, the one or more optical components includes one or more of a acousto-optic modulator or multiple lasers.

In an aspect of the method 1500, controlling the operation of the one or more optical components using the control signal includes controlling at least a phase of the one or more optical components.

In an aspect of the method 1500, controlling the at least a phase of the one or more optical components is done to counter movements on ions in an ion trap caused by the low frequency vibrations.

In an aspect of the method 1500, the QIP system is a cryogenic system and the low frequency vibrations are caused by a closed cycle chiller of the cryogenic system.

Figure 16:
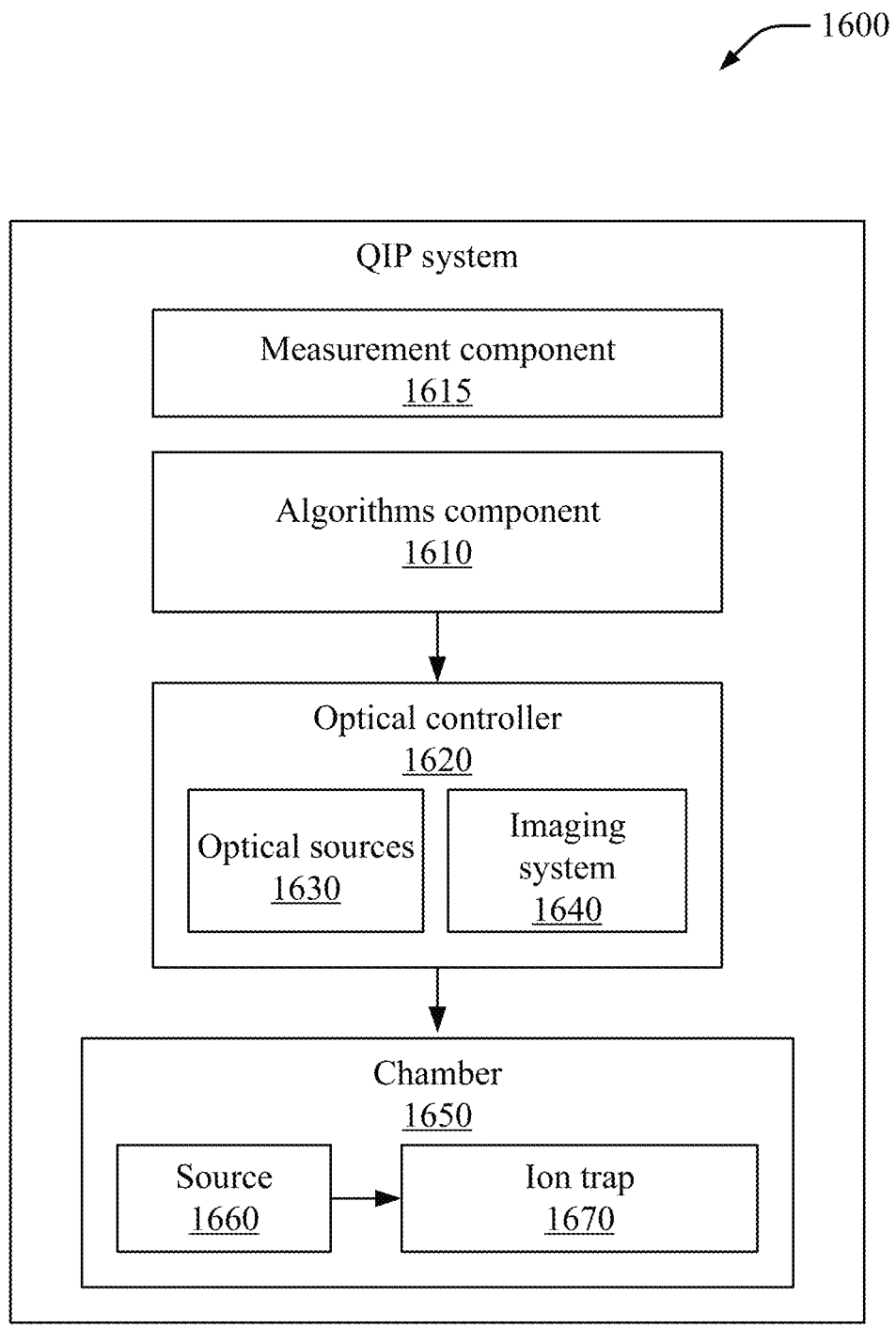
FIG. 16 is a block diagram that illustrates an example of a trapped-ion-based QIP system in accordance with aspects of this disclosure.

FIG. 16 is a block diagram that illustrates an example of a QIP system 1600 in accordance with aspects of this disclosure. The QIP system 1600 may also be referred to as a quantum computing system, a computer device, or the like. In an aspect, the QIP system 1600 may correspond to portions of a quantum computer implementation of a computing device 1700 in FIG. 17. Moreover, aspects of the QIP system 1600 may be shown in connection with FIGS. 1(*a*), 1(*b*), 3, 7, and 12.

The QIP system 100 can include a source 1660 that provides atomic species to a chamber 1650 having an ion trap 1670 that traps the atomic species once ionized by an optical controller 1620. Optical sources 1630 in the optical controller 1620 may include one or more laser sources that can be used for ionization of the atomic species, control (e.g., phase control) of the atomic ions, and for fluorescence of the atomic ions that can be monitored and tracked by image processing algorithms operating in an imaging system 1640 in the optical controller 1620. The imaging system 1640 can include a high resolution imager (e.g., CCD camera) for monitoring the atomic ions while they are being provided to the ion trap 1670 (e.g., for counting) or after they have been provided to the ion trap 1670 (e.g., for monitoring the atomic ions states or for measuring purposes). In an aspect, the imaging system 1640 can be implemented separate from the optical controller 1620, however, the use of fluorescence to detect, identify, and label atomic ions using image processing algorithms may need to be coordinated with the optical controller 1620.

The QIP system 1600 may also include an algorithms component 1610 that may operate with other parts of the QIP system 1600 (not shown) to perform quantum algorithms (e.g., QFT, quantum simulations). As such, the algorithms component 1010 may provide instructions to various components of the QIP system 1600 (e.g., to the optical controller 1020) to enable the implementation of quantum circuits, or their equivalents, such as the ones described herein. That is, the algorithms component 1010 may allow for mapping of different computing primitives into physical representations using, for example, the ion trap 1670.

The QIP system 1600 may also include a measurements component 1615 configured to perform one or more of the measurement or diagnostics techniques described herein in connection with a cryogenic trapped-ion system.

Figure 17:
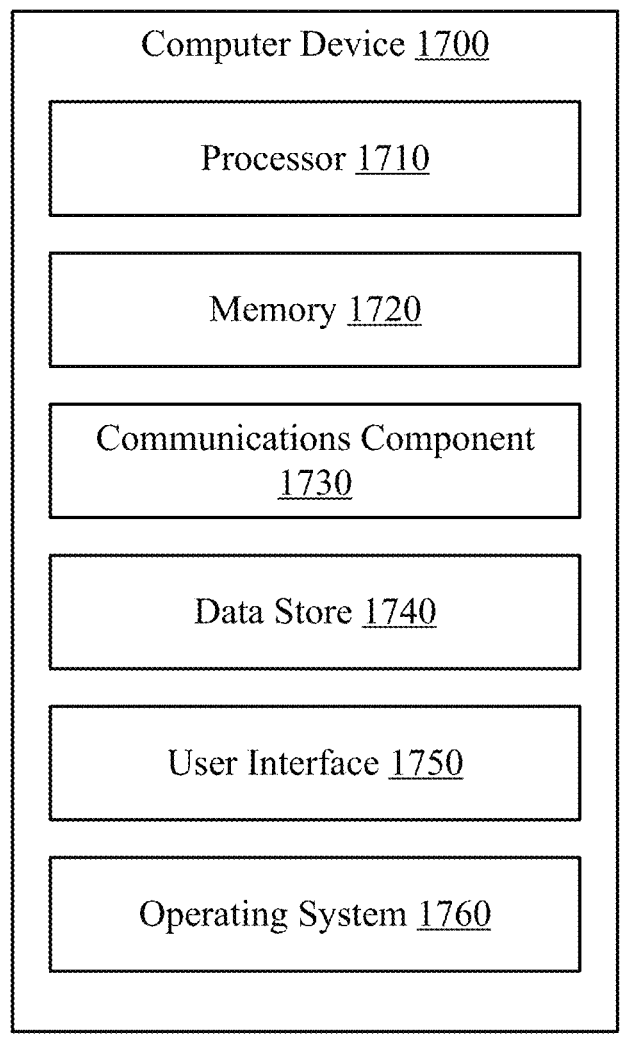
FIG. 17 is a diagram that illustrates an example of a computer device in accordance with aspects of this disclosure.

Referring now to FIG. 17, illustrated is an example computer device 1700 in accordance with aspects of the disclosure. The computer device 1700 can represent a single computing device, multiple computing devices, or a distributed computing system, for example. The computer device 1700 may be configured as a quantum computer, a classical computer, or a combination of quantum and classical computing functions. In an example, the computer device 1700 may be used to perform one or more of the measurement or diagnostics techniques described herein in connection with a cryogenic trapped-ion system. Moreover, the computer device 1700 may be used as a quantum computer and may implement quantum algorithms and/or quantum simulations.

In one example, the computer device 1700 may include a processor 1710 for carrying out processing functions associated with one or more of the features described herein. The processor 1710 may include a single or multiple set of processors or multi-core processors. Moreover, the processor 1710 may be implemented as an integrated processing system and/or a distributed processing system. The processor 1710 may include a central processing unit (CPU), a quantum processing unit (QPU), a graphical processing unit (GPU), or combination of those types of processors.

In an example, the computer device 1700 may include a memory 1720 for storing instructions executable by the processor 1710 for carrying out the functions described herein. In an implementation, for example, the memory 1720 may correspond to a computer-readable storage medium that stores code or instructions to perform one or more of the functions or operations described herein. In one example, the memory 1720 may include instructions to perform aspects of the methods 1300, 1400, and 1500, for example.

Further, the computer device 1700 may include a communications component 1730 that provides for establishing and maintaining communications with one or more parties utilizing hardware, software, and services as described herein. The communications component 1730 may carry communications between components on the computer device 1700, as well as between the computer device 1700 and external devices, such as devices located across a communications network and/or devices serially or locally connected to computer device 1700. For example, the communications component 1730 may include one or more buses, and may further include transmit chain components and receive chain components associated with a transmitter and receiver, respectively, operable for interfacing with external devices.

Additionally, the computer device 1700 may include a data store 1740, which can be any suitable combination of hardware and/or software, that provides for mass storage of information, databases, and programs employed in connection with implementations described herein. For example, the data store 1740 may be a data repository for operating system 1760 (e.g., classical OS, or quantum OS). In one implementation, the data store 1740 may include the memory 1720.

The computer device 1700 may also include a user interface component 1750 operable to receive inputs from a user of the computer device 1700 and further operable to generate outputs for presentation to the user or to provide to a different system (directly or indirectly). The user interface component 1750 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 1750 may include one or more output devices, including but not limited to a display, a speaker, a haptic feedback mechanism, a printer, any other mechanism capable of presenting an output to a user, or any combination thereof.

In an implementation, the user interface component 1750 may transmit and/or receive messages corresponding to the operation of the operating system 1760. In addition, the processor 1710 may execute the operating system 1760 and/or applications or programs (e.g., programs to perform any of the measurements or diagnostics described herein, and the memory 1720 or the data store 1740 may store results from such operations.

When the computer device 1700 is implemented as part of a cloud-based infrastructure solution, the user interface component 1750 may be used to allow a user of the cloud-based infrastructure solution to remotely interact with the computer device 1700.

In this disclosure on a new cryogenic ion trap apparatus has been described for large scale quantum computations, including simulation of spin models. The system is designed and optimized to routinely trap over 100 ions in a linear chain and hold them for hours. The system's mechanical stability is improved, the residual background pressure characterized by measuring the inelastic and elastic collision rate with molecules and used anharmonic potentials to achieve uniformly spaced ion chains.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for performing a pressure measurement in a cryogenic trapped-ion system, comprising:
    establishing a zig-zag ion chain in the cryogenic trapped-ion system;
    detecting a change in a configuration of the zig-zag ion chain; and
    determining a measurement of a pressure in the cryogenic trapped-ion system based on the detected change in the configuration.

2. The method of claim 1, wherein the detected change in the configuration corresponds to a flip of the zig-zag ion chain from a "zig" configuration to a "zag" configuration.

3. The method of claim 1, wherein determining the measurement of the pressure based on the detected change in the configuration is based on a probability of flipping the zig-zag ion chain from a "zig" configuration to a "zag" configuration.

4. The method of claim 1, wherein the detected change in the configuration of the zig-zag ion chain is in response to an elastic collision between the zig-zag ion chain and a residual background molecule or atom.

5. The method of claim 1, wherein:
    detecting the change in the configuration of the zig-zag ion chain includes detecting a rate of change in the configuration of the zig-zag ion chain, and determining the measurement of the pressure based on the detected change in the configuration includes determining the measurement of the pressure based on the rate of change.

6. The method of claim 1, wherein the zig-zag ion chain includes 30 or more ions.

7. The method of claim 1, wherein the establishing of the zig-zag ion chain in the cryogenic trapped-ion system includes: squeezing a linear ion chain so that the linear ion chain buckles in a middle thereof; and loosening the squeezed ion chain without bringing the ion chain back to being fully linear.

8. A quantum information processing (QIP) system for performing a pressure measurement in a cryogenic trapped-ion system, comprising:
- means for establishing a zig-zag ion chain in the cryogenic trapped-ion system;
- means for detecting a change in a configuration of the zig-zag ion chain; and
- means for determining a measurement of a pressure in the cryogenic trapped-ion system based on the detected change in the configuration.

* * * * *